United States Patent
Nomura et al.

(10) Patent No.: US 10,361,658 B2
(45) Date of Patent: Jul. 23, 2019

(54) OSCILLATION MODULE, ELECTRONIC DEVICE, AND MOVING OBJECT

(71) Applicant: Seiko Epson Corporation, Tokyo (JP)

(72) Inventors: Masataka Nomura, Minowa (JP); Shigeki Sasayama, Fujimi (JP); Akira Nakada, Chino (JP); Yoshiki Makiuchi, Minowa (JP)

(73) Assignee: Seiko Epson Corporation (JP)

( * ) Notice: Subject to any disclaimer, the term of this patent is extended or adjusted under 35 U.S.C. 154(b) by 162 days.

(21) Appl. No.: 15/298,515

(22) Filed: Oct. 20, 2016

(65) Prior Publication Data

US 2017/0117848 A1    Apr. 27, 2017

(30) Foreign Application Priority Data

Oct. 26, 2015    (JP) ................................ 2015-209936

(51) Int. Cl.
| | |
|---|---|
| *H01F 5/00* | (2006.01) |
| *H03B 5/12* | (2006.01) |
| *H03B 5/30* | (2006.01) |
| *H03B 19/14* | (2006.01) |

(52) U.S. Cl.
CPC ............. *H03B 5/1243* (2013.01); *H01F 5/00* (2013.01); *H03B 5/1209* (2013.01); *H03B 5/1228* (2013.01); *H03B 5/30* (2013.01); *H03B 19/14* (2013.01); *H03B 2200/004* (2013.01)

(58) Field of Classification Search
CPC .. H03B 5/30; H03B 2200/004; H03B 5/1209; H03B 19/14; H03B 5/1228; H01F 5/00; G01L 3/102; H03H 7/00
USPC ......... 331/154, 167, 108 C, 17 FE; 336/200, 336/183
See application file for complete search history.

(56) References Cited

U.S. PATENT DOCUMENTS

| | | | |
|---|---|---|---|
| 7,274,274 B2* | 9/2007 | Carpentier | H03J 3/24 333/187 |
| 7,683,742 B2* | 3/2010 | Cathelin | H03H 9/17 333/188 |
| 2004/0124931 A1* | 7/2004 | Hajimiri | H03B 5/1852 331/36 L |
| 2006/0055470 A1* | 3/2006 | Luong | H03J 3/20 331/36 L |
| 2007/0085617 A1* | 4/2007 | Salerno | H03F 1/42 331/167 |

FOREIGN PATENT DOCUMENTS

JP    2004-040509 A    2/2004

* cited by examiner

*Primary Examiner* — Arnold M Kinkead
(74) *Attorney, Agent, or Firm* — Harness, Dickey & Pierce, P.L.C.

(57) ABSTRACT

An oscillation module includes an oscillation circuit which includes a first coil and a second coil and a filter circuit which is provided at a stage subsequent to the oscillation circuit and includes a third coil. The first coil, the second coil, and the third coil are a part of an integrated circuit. The third coil is arranged so as to intersect a virtual straight line equidistant from the center of the first coil and the center of the second coil, in a plan view of the integrated circuit.

17 Claims, 11 Drawing Sheets

OSCILLATION MODULE, ELECTRONIC DEVICE, AND MOVING OBJECT

BACKGROUND

1. Technical Field

The present invention relates to an oscillation module, an electronic device, and a moving object.

2. Related Art

JP-A-2004-040509 discloses an oscillation circuit including: a differential amplifier for oscillation configured with an ECL line receiver; a differential amplifier for feedback buffering which is configured with an ECL line receiver and in which an output terminal is terminated due to emitter terminating resistance; a switch circuit; a voltage-controlled phase-shift circuit; a SAW resonator having a predetermined resonance frequency; and an impedance circuit, in which a positive feedback oscillation loop is formed with at least the differential amplifier for oscillation, the differential amplifier for feedback buffering, the voltage-controlled phase-shift circuit, and the SAW resonator. According to this oscillation circuit, the emitter terminating resistance of the differential amplifier for feedback buffering is changed to increase a drive level of the SAW resonator, and accordingly, the amplitude of a signal from the SAW resonator is relatively greater than that of the noise superimposed thereon. That is, since a large SN ratio is obtained, it is possible to decrease jitter caused by noise superimposed on the signal from the SAW resonator.

This oscillation circuit outputs an oscillation signal at a frequency (reference frequency) close to a resonance frequency of the SAW resonator, but it is possible to generate a signal at a frequency which is N times the frequency described above by providing a multiplication circuit at a subsequent stage. The oscillation signal output by the multiplication circuit also contains a component of the reference frequency other than a component of the frequency which is N times the frequency described above, but it is possible to reduce the components of the reference frequency by providing a filter circuit at a stage subsequent to the multiplication circuit. In such a case, magnetic field coupling between a coil contained in the oscillation circuit and a coil contained in the filter circuit may be performed to cause degradation of the oscillation signal.

SUMMARY

An advantage of some aspects of the invention is to provide an oscillation module capable of decreasing degradation of an oscillation signal due to an effect of magnetic field coupling caused between the oscillation circuit and the filter circuit. Another advantage of some aspects of the invention is to provide an electronic device and a moving object using the oscillation module.

The invention can be implemented as the following forms or application examples.

Application Example 1

An oscillation module according to this application example includes: an oscillation circuit which includes a first coil and a second coil; and a filter circuit which is provided at a stage subsequent to the oscillation circuit and includes a third coil, in which the first coil, the second coil, and third coil are a part of an integrated circuit, and the third coil is arranged so as to intersect a virtual straight line equidistant from the center of the first coil and the center of the second coil, in a plan view of the integrated circuit.

According to the oscillation module according to this application example, on the virtual straight line at equivalent distance from the center of the first coil and the center of the second coil, a direction of a magnetic field generated by the first coil and a direction of a magnetic field generated by the second coil are opposite to each other and are weakened. Therefore, according to the oscillation module according to the application example, it is possible to decrease degradation of the oscillation signal due to an effect of magnetic field coupling between the first coil and the second coil included in the oscillation circuit and the third coil included in the filter circuit.

Application Example 2

In the oscillation module according to the application example, the oscillation circuit may include a variable capacitance element, the variable capacitance element may be a part of the integrated circuit, and the variable capacitance element may be arranged between the first coil and the second coil in a plan view of the integrated circuit.

According to the oscillation module according to this application example, when the third coil is close to the first coil and the second coil, it is easy to receive the effect of a magnetic field generated by the first coil or a magnetic field generated by the second coil, but by arranging the variable capacitance element which is hardly affected by the magnetic field between the first coil and the second coil, it is possible to decrease degradation of the oscillation signal while preventing an unnecessary increase in layout area.

Application Example 3

In the oscillation module according to the application example, the oscillation circuit may include a differential amplifier, the differential amplifier may be a part of the integrated circuit, and the differential amplifier may be arranged between the variable capacitance element and the third coil in a plan view of the integrated circuit.

According to the oscillation module according to this application example, since the variable capacitance element is arranged between the first coil and the second coil and the differential amplifier is arranged between the variable capacitance element and the third coil, it is possible to increase the distance between the first coil and the second coil, and the third coil, while preventing an unnecessary increase in layout area. Therefore, according to the oscillation module according to the application example, since the degree of the magnetic field coupling between the first coil and the second coil, and the third coil included in the filter circuit is further reduced, it is possible to further decrease degradation of the oscillation signal due to the effect of the magnetic field coupling.

Application Example 4

In the oscillation module according to the application example, the integrated circuit may include a first pad connected to the first coil and a second pad connected to the second coil, and a distance between the first coil and the first pad may be shorter than a distance between the third coil and the first pad, and a distance between the second coil and the second pad may be shorter than a distance between the third coil and the second pad.

According to the oscillation module according to this application example, it is possible to decrease a length of a wiring connecting the first pad and the first coil or a length of a wiring connecting the second pad and the second coil. According to the oscillation module according to the application example, since the first pad and the second pad can be separated from the third coil, it is possible to reduce a possibility that the frequency component of the current flowing to the first coil or the second coil is coupled with the current flowing to the third coil through the first pad or the second pad. Therefore, according to the oscillation module according to the application example, it is possible to further decrease degradation of the oscillation signal.

Application Example 5

In the oscillation module according to the application example, the oscillation circuit may include a SAW filter including a first input port, a second input port, a first output port, and a second output port, and the first pad may be connected to the first output port and the second pad may be connected to the second output port.

According to the oscillation module according to this application example, it is possible to realize a SAW oscillator capable of decreasing degradation of the oscillation signal due to the effect of the magnetic field coupling.

Application Example 6

In the oscillation module according to the application example, a signal propagating from the first output port to the first input port and a signal propagating from the second output port to the second input port may have phases opposite to each other.

According to the oscillation module according to this application example, since one pair of signals propagating on the feedback path of the oscillation circuit are differential signals, the one pair of signals (differential signals) are amplified by a first differential amplifier and power supply noise to be superimposed thereon as common mode noise is significantly reduced. Therefore, according to the oscillation module according to the application example, it is possible to improve frequency accuracy and S/N of the oscillation signal.

Application Example 7

In the oscillation module according to the application example, the oscillation circuit may be operated by differential motion.

According to the oscillation module according to this application example, since the oscillation circuit is operated by differential motion, the power supply noise to be superimposed on one pair of signals (oscillation signals) propagating on the feedback path of the oscillation circuit as common mode noise is significantly reduced. Therefore, according to the oscillation module according to the application example, it is possible to improve frequency accuracy and S/N of the oscillation signal.

Application Example 8

In the oscillation module according to the application example, the oscillation module may further include an output circuit which is provided at a stage subsequent to the filter circuit, the oscillation circuit may output a differential signal, and the circuits on a signal path from the oscillation circuit to the output circuit may be operated by differential motion.

According to the oscillation module according to this application example, since the power supply noise generated by the operation of the oscillation circuit is superimposed on the differential signal input to each circuit provided at a stage subsequent to the oscillation circuit as a common mode noise, each circuit can output a differential signal having significantly reduced power supply noise by being operated by differential motion. Therefore, according to the oscillation module according to the application example, it is possible to output an oscillation signal having high frequency accuracy in which degradation due to the effect of the power supply noise is reduced.

Application Example 9

An electronic device according to this application example includes: the oscillation module according to any one of the application examples described above.

Application Example 10

A moving object according to this application example includes: the oscillation module according to any one of the application examples described above.

According to these application examples, since an oscillation module capable of decreasing degradation of an oscillation signal due to an effect of magnetic field coupling occurred between the oscillation circuit and the filter circuit is provided, it is possible to realize an electronic device and a moving object having high reliability, for example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferred embodiments of the invention will be described in detail with reference to the drawings. The embodiments which will be described hereinafter do not unjustly limit the contents of the invention disclosed in the aspects. All of configurations which will be described later is not always compulsory configuration requirements of the invention.

1. Oscillation Module 1-1. Structure of Oscillation Module

Figure 1:
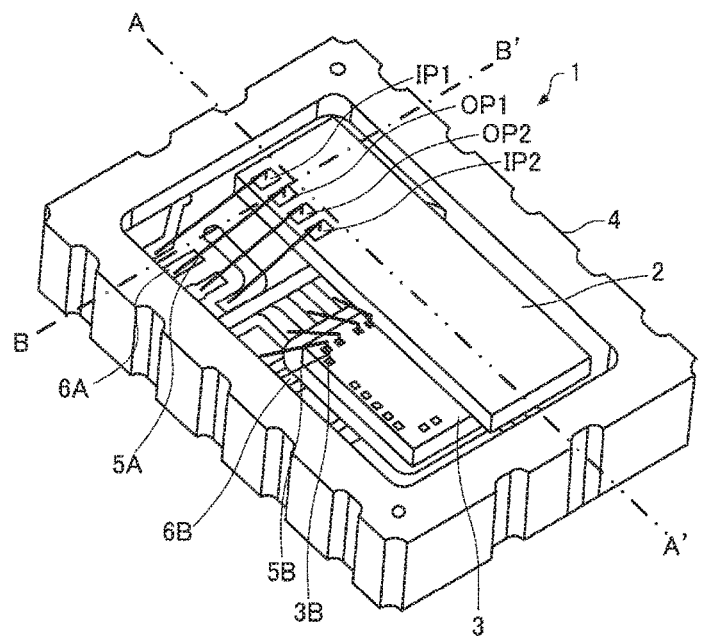
FIG. 1 is a perspective view of an oscillation module of an embodiment.
Figure 2:
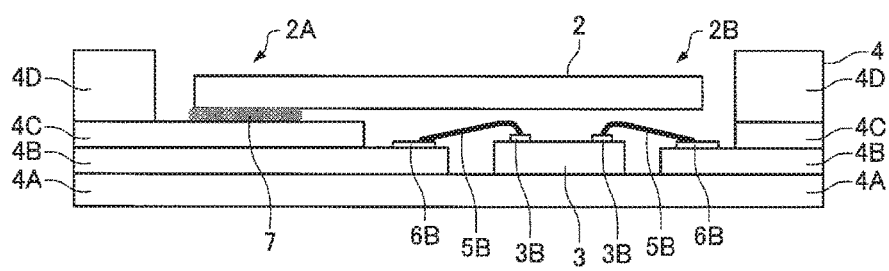
FIG. 2 is a sectional view of the oscillation module which is cut along line A-A' of FIG. 1.
Figure 3:
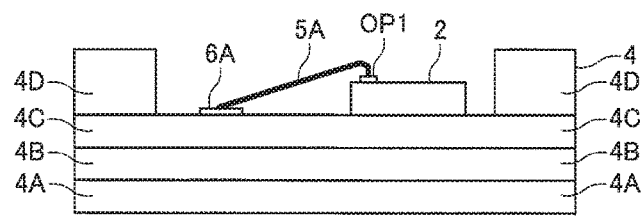
FIG. 3 is a sectional view of the oscillation module which is cut along line B-B' of FIG. 1.

FIG. 1 is a view showing an example of a structure of an oscillation module 1 of the embodiment and is a perspective view of the oscillation module 1. FIG. 2 is a sectional view of the oscillation module 1 which is cut along line A-A' of FIG. 1 and FIG. 3 is a sectional view of the oscillation module 1 which is cut along line B-B' of FIG. 1. FIG. 1 to FIG. 3 show the oscillation module 1 without a lid (cover), but the oscillation module 1 is actually configured by covering an opening of a package 4 with a lid (cover) (not shown).

As shown in FIG. 1, the oscillation module 1 of the embodiment is a surface acoustic wave (SAW) oscillator, and includes a surface acoustic wave filter (SAW filter) 2, an integrated circuit (IC) 3, and the package 4.

The package 4 is, for example, a stacked package such as a ceramic package or the like, and accommodates the SAW filter 2 and the integrated circuit 3 in the same space. Specifically, an opening is provided on the upper portion of the package 4, the opening is covered with a lid (cover) (not shown) to form an accommodation chamber, and the SAW filter and the integrated circuit 3 are accommodated in the accommodation chamber.

As shown in FIG. 2, a lower surface of the integrated circuit 3 is bonded and fixed to an upper surface of a first layer 4A of the package 4. Each electrode (pad) 3B provided on the upper surface of the integrated circuit 3 and each electrode 6B provided on an upper surface of a second layer 4B of the package 4 are bonded to each other through a wire 5B.

One end portion of the SAW filter 2 is fixed to the package 4. More specifically, a lower surface of one end portion (first end portion) 2A of the SAW filter 2 in a longitudinal direction is bonded and fixed to an upper surface of a third layer 4C of the package 4 with an adhesive 7. The other end portion (second end portion) 2B of the SAW filter 2 in the longitudinal direction is not fixed and a gap is provided between the second end portion 2B and the inner surface of the package 4. That is, the SAW filter 2 is fixed to the package 4 in a cantilever state.

As shown in FIG. 1, four electrodes functioning as a first input port IP1, a second input port IP2, a first output port OP1, and a second output port OP2 in the first end portion 2A are provided on the upper surface of the SAW filter 2. As shown in FIG. 1 and FIG. 3, the first input port IP1, the second input port IP2, the first output port OP1, and the second output port OP2 of the SAW filter 2 are bonded to four electrodes 6A provided on the upper surface of the third layer 4C of the package 4 through wires 5A.

Wirings (not shown) for electrically connecting the four electrodes 6A and the four predetermined electrodes 6B respectively are provided in the package 4. That is, the first input port IP1, the second input port IP2, the first output port OP1, and the second output port OP2 of the SAW filter 2 are respectively connected to the four different electrodes (pads) 3B of the integrated circuit 3 through the wires 5A, the wires 5B, and internal wirings of the package 4.

A plurality of external electrodes (not shown) functioning as power terminals, grounding terminals, or output terminals are provided on the surface (external surface) of the package 4, and wirings (not shown) for electrically connecting each of the plural external electrodes and each of the plural predetermined electrodes 6B respectively are also provided in the package 4.

Figure 4:
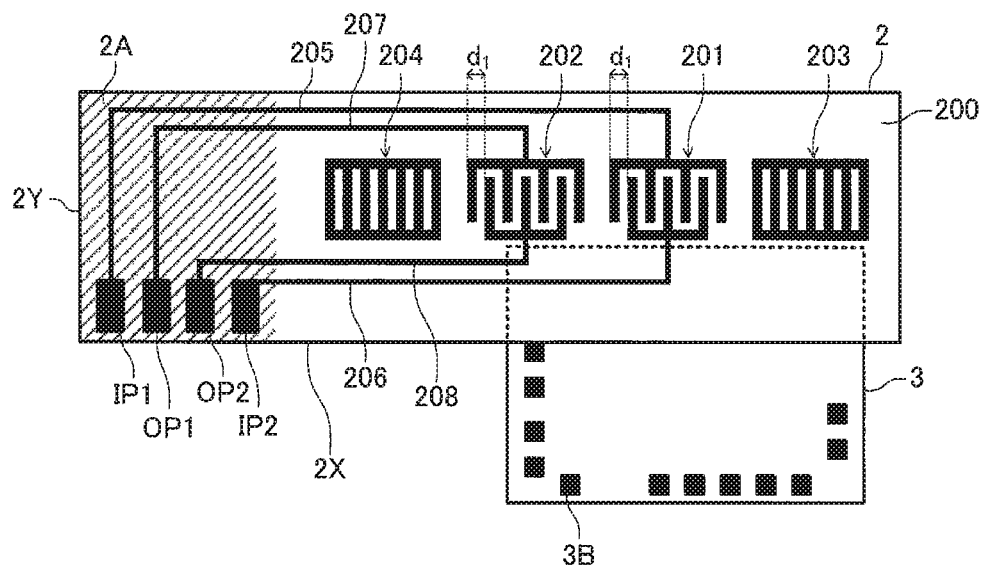
FIG. 4 is a plan view of a SAW filter and an integrated circuit.

FIG. 4 is a plan view of the SAW filter 2 and the integrated circuit 3 in a plan view of the oscillation module 1 of FIG. 1 from the top.

As shown in FIG. 4, the SAW filter 2 includes a first interdigital transducer (IDT) 201, a second IDT 202, a first reflector 203, and a second reflector 204 provided on a surface of a piezoelectric substrate 200.

The piezoelectric substrate 200 can be manufactured by using a single crystal material such as crystal, lithium niobate ($LiNbO_3$), lithium tantalate ($LiTaO_3$), or lithium tetraborate ($Li_2B_4O_7$, LBO), a piezoelectric thin film such as zinc oxide (ZnO) or aluminum nitride (AlN), or a piezoelectric ceramic material.

The first IDT 201 and the second IDT 202 are provided between the first reflector 203 and the second reflector 204, and each IDT is disposed so that two pectinate electrodes including a plurality of electrode fingers provided at regular intervals oppose each other in a mutually inserted manner. As shown in FIG. 4, both of an electrode finger pitch of the first IDT 201 and an electrode finger pitch of the second IDT 202 is a constant value $d_1$.

The SAW filter 2 includes the first input port IP1 connected to the first IDT 201, the second input port IP2 connected to the first IDT 201, the first output port OP1 connected to the second IDT 202, and the second output port OP2 connected to the second IDT 202 which are provided on the surface of the piezoelectric substrate 200.

Specifically, a first wiring 205 and a second wiring 206 are provided on the surface of the piezoelectric substrate 200, the first input port IP1 is connected to one electrode (upper electrode in FIG. 4) of the first IDT 201 through the first wiring 205, and the second input port IP2 is connected to the other electrode (lower electrode in FIG. 4) of the first IDT 201 through the second wiring 206. A third wiring 207 and a fourth wiring 208 are provided on the surface of the piezoelectric substrate 200, the first output port OP1 is connected to one electrode (upper electrode in FIG. 4) of the second IDT 202 through the third wiring 207, and the second output port OP2 is connected to the other electrode (lower electrode in FIG. 4) of the second IDT 202 through the fourth wiring 208.

In the SAW filter 2 configured as described above, when an electric signal having a frequency close to $f=v/(2d_1)$ (v is velocity at which the propagating of surface acoustic waves is carried out along the surface of the piezoelectric substrate 200) is input from the first input port IP1 and the second input port IP2, surface acoustic waves having one wavelength equivalent to $2d_1$ is excited by the first IDT 201. The surface acoustic waves excited by the first IDT 201 are reflected between the first reflector 203 and the second reflector 204 and become stationary waves. The stationary waves are converted into electric signals in the second IDT 202 and output from the first output port OP1 and the second output port OP2. That is, the SAW filter 2 functions as a band pass filter in a narrowband in which a center frequency is $f=v/(2d_1)$.

In the embodiment, as shown in FIG. 4, at least a part of the SAW filter 2 is overlapped with the integrated circuit 3 in a plan view. In a plan view, the first end portion 2A (portion with oblique lines in FIG. 4) of the SAW filter 2 is not overlapped with the integrated circuit 3. As described above, in the embodiment, the SAW filter 2 is set in a cantilever state by fixing the first end portion 2A to the package 4, and the integrated circuit 3 is disposed in a space formed under the SAW filter 2, to realize miniaturization of the oscillation module 1.

According to the oscillation module 1 of the embodiment, since not the entire surface of the SAW filter 2, but the first end portion 2A which is a part thereof is fixed to the package 4, an area of the portion to be fixed is small and the portion which is easily deformed due to stress applied from the package 4 is small. Therefore, according to the oscillation module 1 of the embodiment, it is possible to decrease degradation of an oscillation signal due to stress applied to the SAW filter 2.

Since the rear surface of the piezoelectric substrate 200 of the first end portion 2A of the SAW filter 2 is fixed to the package 4 with the adhesive 7, the first end portion 2A is also easily deformed due to shrinkage of the adhesive 7. Therefore, in the embodiment, as shown in FIG. 4, the first IDT 201, the second IDT 202, the first reflector 203, and the second reflector 204 are not provided on the surface of the piezoelectric substrate 200 of the first end portion 2A. Accordingly, the deformation of the first IDT 201 and the second IDT 202 is significantly alleviated. Therefore, according to the embodiment, since it is possible to reduce errors with respect to a target value of the electrode finger pitch $d_1$ caused by deformation of the first IDT 201 or the second IDT 202 caused by the stress due to shrinkage of the adhesive 7, it is possible to realize the oscillation module 1 with high frequency accuracy.

In the embodiment, since the SAW filter 2 is in a cantilever state, stress due to contact with the package 4 is not applied to the second end portion 2B which is a free end. Accordingly, according to the embodiment, since the deformation of the first IDT 201 and the second IDT 202 caused by the stress due to the contact with the package 4 does not occur, it is possible to realize the oscillation module 1 with high frequency accuracy.

In the embodiment, the first input port IP1, the second input port IP2, the first output port OP1, and the second output port OP2, the characteristics of which do not change due to the modification, are provided on the surface of the piezoelectric substrate 200 of the first end portion 2A of the SAW filter 2. Therefore, an unnecessary increase in size of the SAW filter 2 is avoided and the oscillation module 1 can be miniaturized.

In the embodiment, as shown in FIG. 4, the SAW filter 2 has a rectangular shape including long sides 2X and short sides 2Y, and the first input port IP1, the second input port IP2, the first output port OP1, and the second output port OP2 are arranged along the long side 2X of the SAW filter 2 in a plan view. Therefore, according to the embodiment, as shown in FIG. 1, since all of four wires 5A respectively connected to the first input port IP1, the second input port IP2, the first output port OP1, and the second output port OP2 can be provided on the long side 2X side in the outer portion of the SAW filter 2, it is possible to reduce the space on a side of the short side by efficiently using the space on a side of the long side of the SAW filter 2 in the package 4, therefore, it is possible to miniaturize the oscillation module 1.

In the embodiment, as shown in FIG. 4, the first input port IP1 and the second input port IP2 are arranged to be equidistant from the long side 2X and the first output port OP1 and the second output port OP2 are arranged to be equidistant from the long side 2X, in a plan view. Accordingly, according to the embodiment, the length of the wirings (wire 5A and substrate wiring) connected to the first input port IP1 and the length of the wirings connected to the second input port IP2 easily become to be equidistant from each other, the length of the wirings connected to the first output port OP1 and the length of the wirings connected to the second output port OP2 easily become to be equidistant from each other, and therefore, it is possible to reduce a deviation from 180° of a phase difference of differential signals input to or output from the SAW filter 2.

Figure 5:
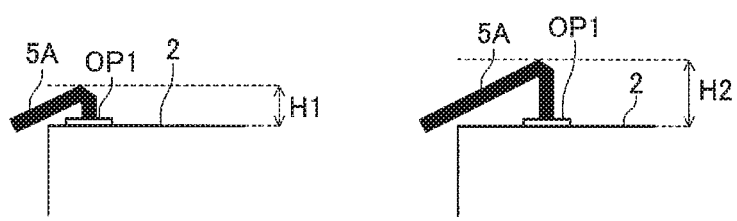
FIG. 5 is an explanatory diagram of effects of the oscillation module of the embodiment.

In addition, in the embodiment, as shown in FIG. 4, the first input port IP1, the second input port IP2, the first output port OP1, the second output port OP2 are arranged to be equidistant from the long side 2X, in a plan view. Accordingly, the heights of the four wires 5A respectively connected to the first input port IP1, the second input port IP2, the first output port OP1, the second output port OP2 easily become the same. Particularly, in the embodiment, since the first input port IP1, the second input port IP2, the first output port OP1, the second output port OP2 are provided at a position close to the long side 2X along the long side 2X, it is possible to reduce a height H1 from the upper surface of the SAW filter 2 to the highest part of the wire 5A, as shown in a sectional view on the left side of FIG. 5 (sectional view showing a part of FIG. 3). The drawing on the right side of FIG. 5 shows a sectional view of a case where the first input port IP1, the second input port IP2, the first output port OP1, the second output port OP2 are provided at a position far from the long side 2X, and a height H2 from the upper surface of the SAW filter 2 to the highest part of the wire 5A is higher than the height H1. As described above, according to the embodiment, since the height of the wire 5A can be decreased, it is possible to reduce the size of the package 4 in the height direction and to realize miniaturization of the oscillation module 1.

In the embodiment, as shown in FIG. 4, the first input port IP1, the first output port OP1, the second output port OP2, and the second input port IP2 are arranged in this order in a direction along the long side 2X in a plan view. Therefore, in a case where the first IDT 201 and the second IDT 202 are arranged in a direction along the long side 2X, it is easy to provide the first wiring 205, the second wiring 206, the third wiring 207, and the fourth wiring 208 without causing intersection, and thus, it is possible to reduce the length of the wirings.

The SAW filter 2 is not limited to the configuration of FIG. 4 and may be a transversal SAW filter which propagates surface acoustic waves between an IDT for input and an IDT for output without including a reflector, for example.

1-2. Functional Configuration of Oscillation Module

Figure 6:
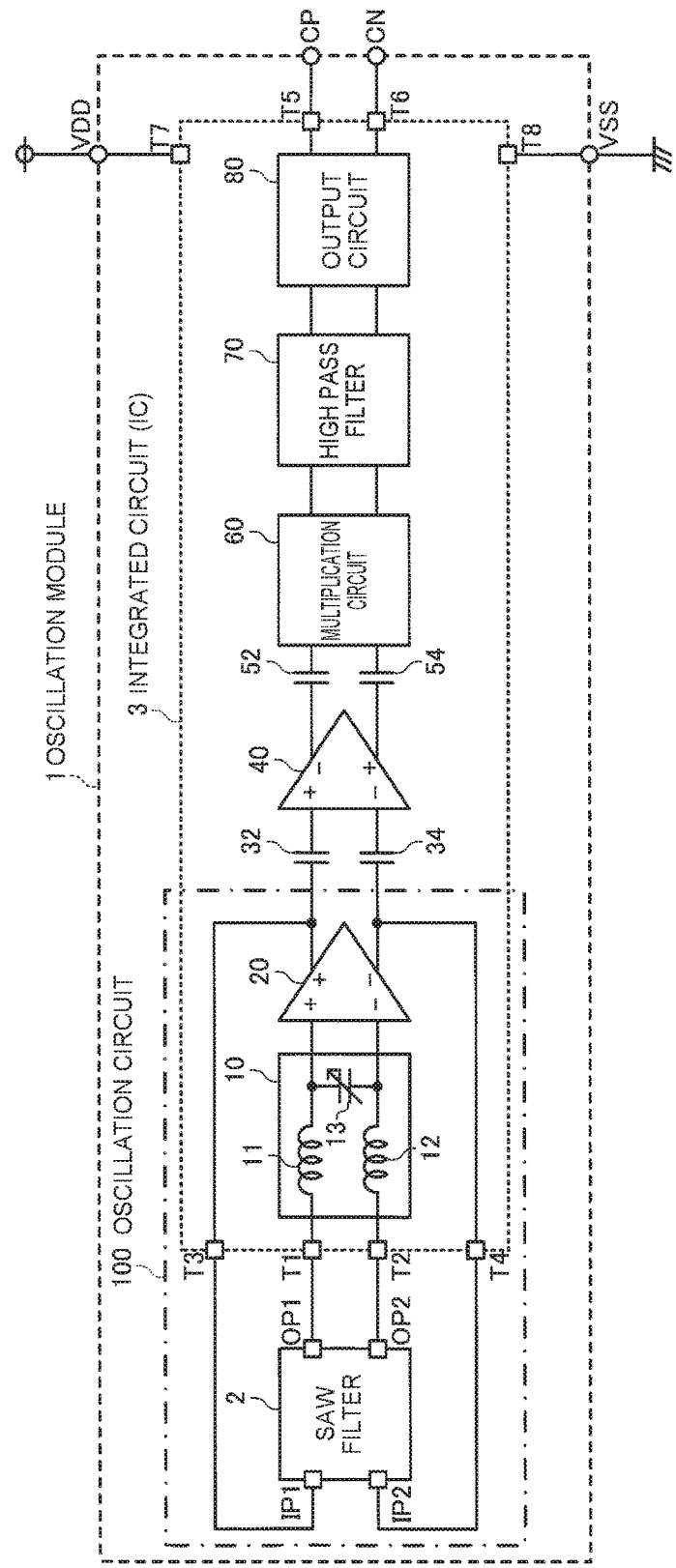
FIG. 6 is a block diagram showing an example of a functional configuration of the oscillation module of the embodiment.

FIG. 6 is a block diagram showing an example of a functional configuration of the oscillation module 1 of the embodiment. As shown in FIG. 6, the oscillation module 1 of the embodiment includes the SAW filter 2, a phase shift circuit 10, a differential amplifier 20 (first differential amplifier), a capacitor 32, a capacitor 34, a differential amplifier 40 (second differential amplifier), a capacitor 52, a capacitor 54, a multiplication circuit 60, a high pass filter 70 (filter circuit), and an output circuit 80. Some elements of the oscillation module 1 of the embodiment may be suitably omitted or changed or other elements may be added.

The phase shift circuit 10, the differential amplifier 20, the capacitor 32, the capacitor 34, the differential amplifier 40, the capacitor 52, the capacitor 54, the multiplication circuit 60, the high pass filter 70, and the output circuit 80 are contained in the integrated circuit 3. That is, these circuits are some parts of the integrated circuit 3.

The first output port OP1 of the SAW filter 2 is connected to an input terminal T1 of the integrated circuit 3. The second output port OP2 of the SAW filter 2 is connected to an input terminal T2 of the integrated circuit 3. The first input port IP1 of the SAW filter 2 is connected to an output terminal T3 of the integrated circuit 3. The second input port IP2 of the SAW filter 2 is connected to an output terminal T4 of the integrated circuit 3.

A power supply terminal T7 of the integrated circuit 3 is connected to a VDD terminal which is an external terminal (external electrode provided on the surface of the package 4) of the oscillation module 1, and a desired power supply potential is supplied to the power supply terminal T7 through the VDD terminal. A grounding terminal T8 of the integrated circuit 3 is connected to a VSS terminal which is an external terminal of the oscillation module 1, and a grounding potential (0 V) is supplied to the grounding terminal T8 through the VSS terminal. The phase shift circuit 10, the differential amplifier 20, the capacitor 32, the capacitor 34, the differential amplifier 40, the capacitor 52, the capacitor 54, the multiplication circuit 60, the high pass filter 70, and the output circuit 80 operate with a potential difference between the power supply terminal T7 and the grounding terminal T8 as a power supply voltage. Each power supply terminal and each grounding terminal of the differential amplifier 20, the differential amplifier 40, the multiplication circuit 60, the high pass filter 70, and the output circuit 80 are respectively connected to the power supply terminal T7 and the grounding terminal T8 and the connection thereof is not shown in FIG. 6.

The phase shift circuit 10 and the differential amplifier 20 are provided on a feedback path from the first output port OP1 and the second output port OP2 to the first input port IP1 and the second input port IP2 of the SAW filter 2.

The phase shift circuit 10 includes a coil 11 (first coil), a coil 12 (second coil), and a variable capacitance element 13. Inductance of the coil 11 and inductance of the coil 12 may be the same with each other (difference due to variation in manufacturing processes is allowable) or substantially the same with each other.

One end of the coil 11 is connected to the input terminal T1 of the integrated circuit 3 and the other end of the coil 11 is connected to one end of the variable capacitance element 13 and a non-inversion input terminal of the differential amplifier 20. One end of the coil 12 is connected to the input terminal T2 of the integrated circuit 3 and the other end of the coil 12 is connected to the other end of the variable capacitance element 13 and an inversion input terminal of the differential amplifier 20.

The variable capacitance element 13 may be, for example, a varactor (also referred to as a varicap or a variable capacitance diode) of which a capacitance value changes according to a voltage applied, or may be a circuit which includes a plurality of capacitors, and a plurality of switches for selecting at least some of the plurality of capacitors and switches a capacitance value according to the capacitor selected by opening or closing the plurality of switches according to a selected signal.

The differential amplifier 20 outputs a pair of signals input to the non-inversion input terminal and the inversion input terminal from the non-inversion output terminal and the inversion output terminal by amplifying a potential difference therebetween. The non-inversion input terminal of the differential amplifier 20 is connected to the output terminal T3 of the integrated circuit 3 and one end of the capacitor 32. The inversion input terminal of the differential amplifier 20 is connected to the output terminal T4 of the integrated circuit 3 and one end of the capacitor 34.

Figure 7:
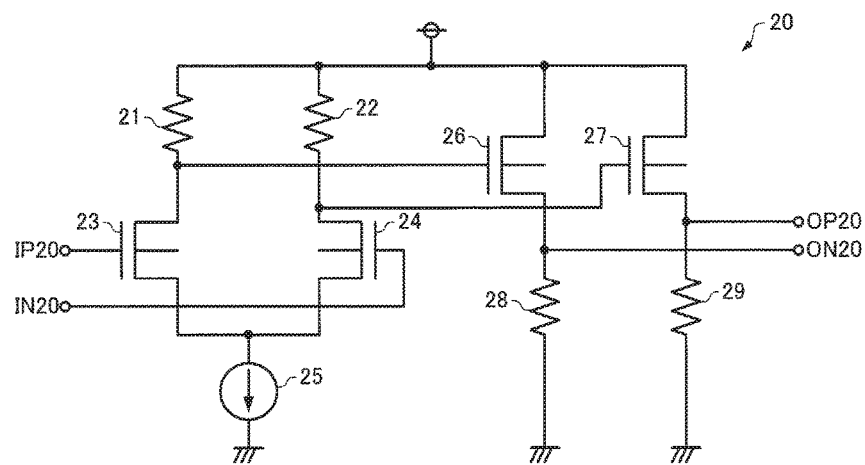
FIG. 7 is a view showing an example of a circuit configuration of a differential amplifier.

FIG. 7 is a view showing an example of a circuit configuration of the differential amplifier 20. In the example of FIG. 7, the differential amplifier 20 is configured to include a resistor 21, a resistor 22, a negative-channel metal oxide semiconductor (NMOS) transistor 23, an NMOS transistor 24, a constant current source 25, an NMOS transistor 26, an NMOS transistor 27, a resistor 28, and a resistor 29. In FIG. 7, an input terminal IP20 is a non-inversion input terminal and an input terminal IN20 is an inversion input terminal, for example. In addition, an output terminal OP20 is a non-inversion output terminal and an output terminal ON20 is an inversion output terminal.

In the NMOS transistor 23, a gate terminal is connected to the input terminal IP20, a source terminal is connected to one end of the constant current source 25, and a drain terminal is connected to the power supply terminal T7 (see FIG. 6) through the resistor 21.

In the NMOS transistor 24, a gate terminal is connected to the input terminal IN20, a source terminal is connected to one end of the constant current source 25, and a drain terminal is connected to the power supply terminal T7 (see FIG. 6) through the resistor 22.

The other end of the constant current source 25 is connected to the grounding terminal T8 (see FIG. 6).

In the NMOS transistor 26, a gate terminal is connected to the drain terminal of the NMOS transistor 23, a source terminal is connected to the grounding terminal T8 (see FIG. 6) through the resistor 28, and a drain terminal is connected to the power supply terminal T7 (see FIG. 6).

In the NMOS transistor 27, a gate terminal is connected to the drain terminal of the NMOS transistor 24, a source terminal is connected to the grounding terminal T8 (see FIG. 6) through the resistor 29, and a drain terminal is connected to the power supply terminal T7 (see FIG. 6).

The source terminal of the NMOS transistor 26 is connected to the output terminal OP20 and the source terminal of the NMOS transistor 27 is connected to the output terminal ON20.

The differential amplifier 20 configured as described above performs non-inversion amplification of a pair of signals input to the input terminal IP20 and the input terminal IN20 and outputs the signals from the output terminal OP20 and the output terminal ON20.

Returning to FIG. 6, in the embodiment, one pair of signals is propagated on a signal path from the first output port OP1 and the second output port OP2 to the first input port IP1 and the second input port IP2 of the SAW filter 2 by the SAW filter 2, the phase shift circuit 10, and the differential amplifier 20 to configure a positive feedback closed loop and the one pair of signals become oscillation signals. That is, the oscillation circuit 100 is configured with the SAW filter 2, the phase shift circuit 10, and the differential amplifier 20. Some elements of the oscillation circuit 100 of the embodiment may be suitably omitted or changed or other elements may be added.

Figure 8:
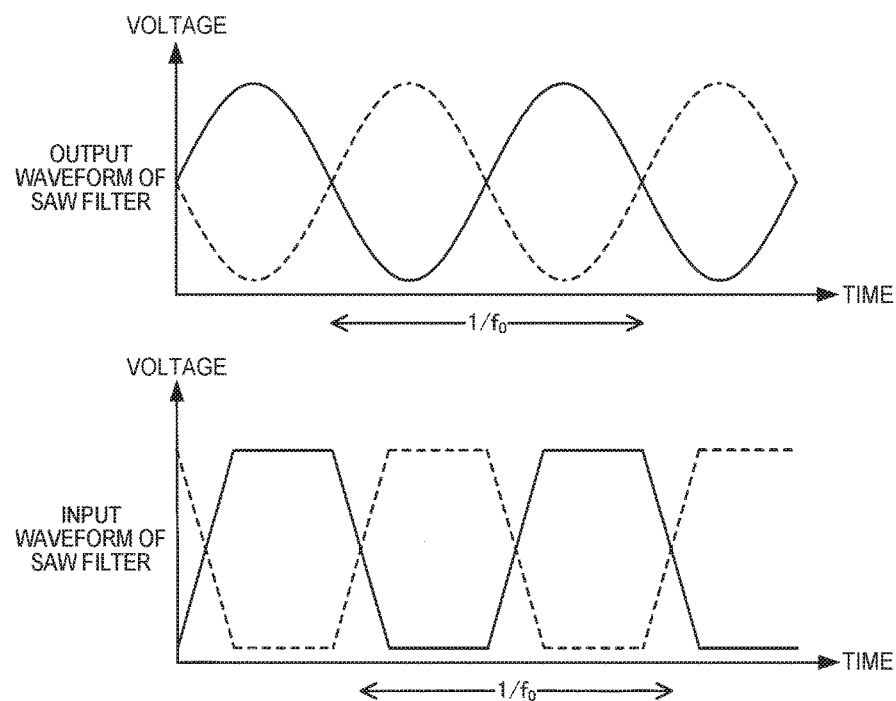
FIG. 8 is a view showing an example of input and output waveforms of the SAW filter.

An upper drawing of FIG. 8 shows a waveform of a signal (frequency $f_0$) output from the first output port OP1 of the SAW filter 2 using a solid line and a waveform of a signal (frequency $f_0$) output from the second output port OP2 of the SAW filter 2 using a broken line. A lower drawing of FIG. 8 shows a waveform of a signal (frequency $f_0$) input to the first input port IP1 of the SAW filter 2 using a solid line and a waveform of a signal (frequency $f_0$) input to the second input port IP2 of the SAW filter 2 using a broken line.

As shown in FIG. 8, the signal (solid line) propagating from the first output port OP1 to the first input port IP1 of the SAW filter 2 and the signal (broken line) propagating from the second output port OP2 to the second input port IP2 of the SAW filter 2 have phases opposite to each other. Here, "opposite phases" is an expression including not only a case where a phase difference is accurately 180°, but also a case where a phase difference between the wiring of the feedback path from the first output port OP1 to the first input port IP1 of the SAW filter 2 and the wiring of the feedback path from the second output port OP2 to the second input port IP2 of the SAW filter 2 is deviated from 180° by an amount of a difference in length, resistance, or capacitance, or a difference of characteristics of elements included in the differential amplifier 20 generated due to manufacturing errors.

As described above, the oscillation circuit 100 of the embodiment oscillates by amplifying the differential signals (one pair of signals having phases opposite to each other) output from the first output port OP1 and the second output port OP2 of the SAW filter 2 by the differential amplifier 20 and causing feedback of the signals to the first input port IP1 and the second input port IP2 of the SAW filter 2 to configure a feedback path of a closed loop. That is, the oscillation circuit 100 is operated by differential motion and oscillates at a frequency $f_0$ according to an electrode finger pitch $d_1$ of the first IDT 201 and the second IDT 202.

Since power supply noise superimposed on the differential signal propagating on the feedback path from the first output port OP1 and the second output port OP2 to the first input port IP1 and the second input port IP2 of the SAW filter 2 through the power supply line is common mode noise, the power supply noise is significantly reduced by the differential amplifier 20. Therefore, according to the oscillation circuit 100, it is possible to reduce degradation of the oscillation signal due to the effect of the power supply noise and to improve frequency accuracy and S/N of the oscillation signal.

The oscillation circuit 100 of the embodiment changes a capacitance value of the variable capacitance element 13 of the phase shift circuit 10, and accordingly, it is possible to change the frequency $f_0$ of the oscillation signal over a variable range according to the inductance of the coil 11 and the inductance of the coil 12 in a passband of the SAW filter 2. As the inductance of the coil 11 and the inductance of the coil 12 are great, the variable range of frequency $f_0$ is great.

In the oscillation circuit 100 of the embodiment, current having phases opposite to each other flow to the coil 11 and the coil 12. Accordingly, since a direction of a magnetic field generated by the coil 11 and a direction of a magnetic field generated by the coil 12 are opposite to each other and are weakened, it is possible to reduce the degradation of the oscillation signal due to the effect of the magnetic field.

A SAW resonator has rapidly-changing frequency characteristics with respect to reactance, whereas the SAW filter 2 has linear (slowly-changing) frequency characteristics with respect to reactance, and accordingly, the oscillation circuit 100 of the embodiment can easily control a variable range of the frequency $f_0$ compared to an oscillation circuit using the SAW resonator.

Returning to FIG. 6, the oscillation module 1 is provided with the capacitor 32, the capacitor 34, the differential amplifier 40, the capacitor 52, the capacitor 54, the multiplication circuit 60, the high pass filter 70, and the output circuit 80 at a stage subsequent to the oscillation circuit 100.

One end of the capacitor 32 is connected to the non-inversion output terminal (output terminal OP20 of FIG. 7) of the differential amplifier 20 and the other end thereof is connected to the non-inversion input terminal of the differential amplifier 40. One end of the capacitor 34 is connected to the inversion output terminal (output terminal ON20 of FIG. 7) of the differential amplifier 20 and the other end thereof is connected to the inversion input terminal of the differential amplifier 40. The capacitor 32 and the capacitor 34 function as capacitors for DC cut and removes DC components of each signal output from the non-inversion output terminal (output terminal OP20 of FIG. 7) and the inversion output terminal (output terminal ON20 of FIG. 7) of the differential amplifier 20.

The differential amplifier 40 is provided on a signal path from the oscillation circuit 100 to the multiplication circuit 60. The differential amplifier 40 outputs differential signals obtained by amplifying differential signals input to the non-inversion input terminal and the inversion input terminal from the non-inversion output terminal and the inversion output terminal.

Figure 9:
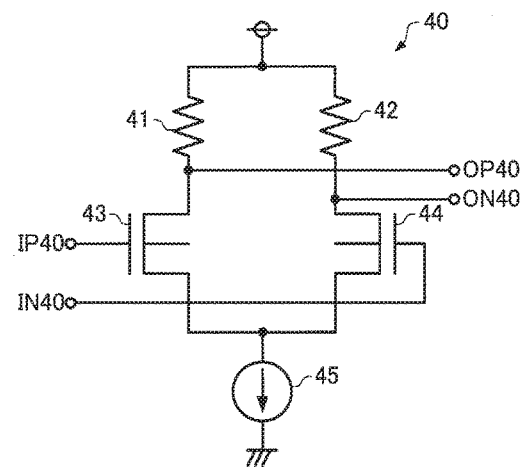
FIG. 9 is a view showing an example of a circuit configuration of a differential amplifier.

FIG. 9 is a view showing an example of a circuit configuration of the differential amplifier 40. In the example of FIG. 9, the differential amplifier 40 includes a resistor 41, a resistor 42, an NMOS transistor 43, an NMOS transistor 44, and a constant current source 45. In FIG. 9, an input terminal IP40 is a non-inversion input terminal and an input terminal IN40 is an inversion input terminal, for example. In addition, an output terminal OP40 is a non-inversion output terminal and an output terminal ON40 is an inversion output terminal.

In the NMOS transistor 43, a gate terminal is connected to the input terminal IP40, a source terminal is connected to one end of the constant current source 45, and a drain terminal is connected to the power supply terminal T7 (see FIG. 6) through the resistor 41.

In the NMOS transistor 44, a gate terminal is connected to the input terminal IN40, a source terminal is connected to one end of the constant current source 45, and a drain terminal is connected to the power supply terminal T7 (see FIG. 6) through the resistor 42.

The other end of the constant current source 45 is connected to the grounding terminal T8 (see FIG. 6).

The drain terminal of the NMOS transistor 43 is connected to the output terminal OP40 and the drain terminal of the NMOS transistor 44 is connected to the output terminal ON40.

The differential amplifier 40 configured as described above performs inversion amplification of the differential signals input to the input terminal IP40 and the input terminal IN40 and outputs the amplified differential signals from the output terminal OP40 and the output terminal ON40.

Returning to FIG. 6, one end of the capacitor 52 is connected to the non-inversion output terminal (output terminal OP40 of FIG. 9) of the differential amplifier 40 and the other end thereof is connected to the non-inversion input terminal of the multiplication circuit 60. One end of the capacitor 54 is connected to the inversion output terminal (output terminal ON40 of FIG. 9) of the differential amplifier 40 and the other end thereof is connected to the inversion input terminal of the multiplication circuit 60. The capacitor 52 and the capacitor 54 function as capacitors for DC cut and remove DC components of each signal output from the non-inversion output terminal (output terminal OP40 of FIG. 9) and the inversion output terminal (output terminal ON40 of FIG. 9) of the differential amplifier 40.

The multiplication circuit 60 is operated by differential motion and outputs differential signals obtained by multiplying the frequency $f_0$ of differential signals input to the non-inversion input terminal and the inversion input terminal from the non-inversion output terminal and the inversion output terminal.

Figure 10:
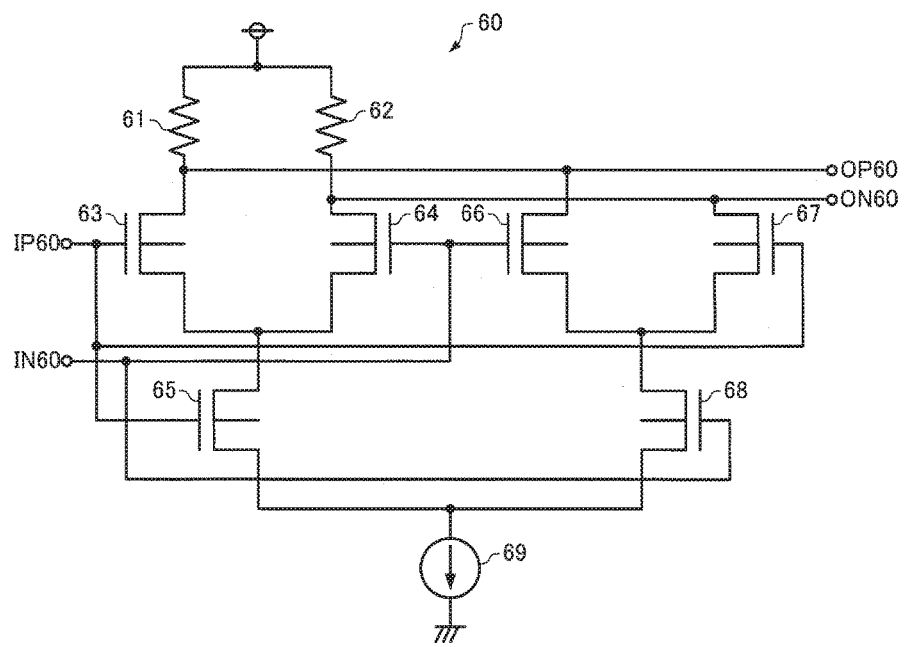
FIG. 10 is a view showing an example of a circuit configuration of a multiplication circuit.

FIG. 10 is a view showing an example of a circuit configuration of the multiplication circuit 60. In the example of FIG. 10, the multiplication circuit 60 is configured to include a resistor 61, a resistor 62, an NMOS transistor 63, an NMOS transistor 64, an NMOS transistor 65, an NMOS transistor 66, an NMOS transistor 67, an NMOS transistor 68, and a constant current source 69. In FIG. 10, an input terminal IP60 is a non-inversion input terminal and an input terminal IN60 is an inversion input terminal, for example. In addition, an output terminal OP60 is a non-inversion output terminal and an output terminal ON60 is an inversion output terminal.

In the NMOS transistor 63, a gate terminal is connected to the input terminal IP60, a source terminal is connected to a drain terminal of the NMOS transistor 65, and a drain terminal is connected to the power supply terminal T7 (see FIG. 6) through the resistor 61.

In the NMOS transistor 64, a gate terminal is connected to the input terminal IN60, a source terminal is connected to the drain terminal of the NMOS transistor 65, and a drain terminal is connected to the power supply terminal T7 (see FIG. 6) through the resistor 62.

In the NMOS transistor 65, a gate terminal is connected to the input terminal IP60, a source terminal is connected to one end of the constant current source 69, and a drain terminal is connected to the source terminal of the NMOS transistor 63 and the source terminal of the NMOS transistor 64.

In the NMOS transistor 66, a gate terminal is connected to the input terminal IN60, a source terminal is connected to a drain terminal of the NMOS transistor 68, and a drain terminal is connected to the power supply terminal T7 (see FIG. 6) through the resistor 61.

In the NMOS transistor 67, a gate terminal is connected to the input terminal IP60, a source terminal is connected to the drain terminal of the NMOS transistor 68, and a drain terminal is connected to the power supply terminal T7 (see FIG. 6) through the resistor 62.

In the NMOS transistor 68, a gate terminal is connected to the input terminal IN60, a source terminal is connected to one end of the constant current source 69, and a drain terminal is connected to the source terminal of the NMOS transistor 66 and the source terminal of the NMOS transistor 67.

The other end of the constant current source 69 is connected to the grounding terminal T8 (see FIG. 6).

The drain terminal of the NMOS transistor 63 and the drain terminal of the NMOS transistor 66 are connected to the output terminal OP60, and the drain terminal of the NMOS transistor 64 and the drain terminal of the NMOS transistor 67 are connected to the output terminal ON60.

The multiplication circuit 60 configured as described above generates differential signals of a frequency $2f_0$ which is double of the frequency $f_0$ of the differential signals input to the input terminal IP60 and the input terminal IN60 and outputs the differential signals from the output terminal OP60 and the output terminal ON60. Particularly, the multiplication circuit 60 is an equilibrium modulation circuit and has a configuration in which the differential signals (signal of $f_0$) input to the input terminal IP60 and the input terminal IN60 are not output from the output terminal OP60 and the output terminal ON60 in principle. According to the multiplication circuit 60, even after considering a manufacturing variation of each NMOS transistor or each resistor, it is possible to decrease the amount of signal components of $f_0$ output from the output terminal OP60 and the output terminal ON60, differential signals of $2f_0$ having high purity (high frequency accuracy) are obtained and the circuit area is also comparatively small.

Returning to FIG. 6, the non-inversion output terminal (output terminal OP60 of FIG. 10) of the multiplication circuit 60 is connected to the non-inversion input terminal of the high pass filter 70. The inversion output terminal (output terminal ON60 of FIG. 10) of the multiplication circuit 60 is connected to the inversion input terminal of the high pass filter 70.

The high pass filter 70 is provided on a signal path from the multiplication circuit 60 to the output circuit 80. The high pass filter 70 is operated by differential motion and outputs differential signals having low frequency components attenuated from the differential signals input to the non-inversion input terminal and the inversion input terminal from the non-inversion output terminal and the inversion output terminal.

Figure 11:
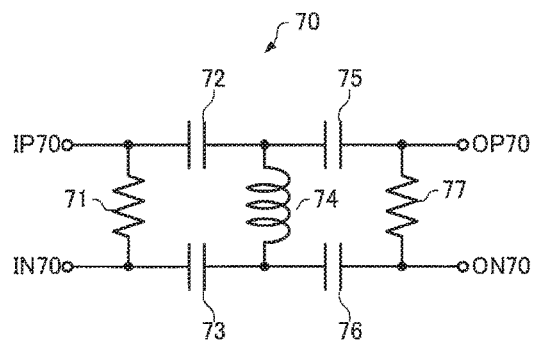
FIG. 11 is a view showing an example of a circuit configuration of a high pass filter.

FIG. 11 is a view showing an example of a circuit configuration of the high pass filter 70. In the example of FIG. 11, the high pass filter 70 is configured to include a resistor 71, a capacitor 72, a capacitor 73, a coil 74 (third coil), a capacitor 75, a capacitor 76, and a resistor 77. In FIG. 11, an input terminal IP70 is a non-inversion input terminal and an input terminal IN70 is an inversion input terminal, for example. In addition, an output terminal OP70 is a non-inversion output terminal and an output terminal ON70 is an inversion output terminal.

In the resistor 71, one end is connected to the input terminal IP70 and one end of the capacitor 72 and the other end is connected to the input terminal IN70 and one end of the capacitor 73.

In the capacitor 72, one end is connected to the input terminal IP70 and one end of the resistor 71 and the other end is connected to one end of the coil 74 and one end of the capacitor 75.

In the capacitor 73, one end is connected to the input terminal IN70 and the other end of the resistor 71 and the other end is connected to the other end of the coil 74 and one end of the capacitor 76.

In the coil 74, one end is connected to the other end of the capacitor 72 and one end of the capacitor 75 and the other end is connected to the other end of the capacitor 73 and one end of the capacitor 76.

In the capacitor 75, one end is connected to the other end of the capacitor 72 and one end of the coil 74 and the other end is connected to one end of the resistor 77.

In the capacitor 76, one end is connected to the other end of the capacitor 73 and the other end of the coil 74 and the other end is connected to the other end of the resistor 77.

In the resistor 77, one end is connected to the other end of the capacitor 75 and the other end is connected to the other end of the capacitor 76.

The other end of the capacitor 75 and one end of the resistor 77 are connected to the output terminal OP70 and the other end of the capacitor 76 and the other end of the resistor 77 are connected to the output terminal ON70.

The high pass filter 70 configured as described above generates differential signals having low frequency components attenuated from the differential signals input to the input terminal IP70 and the input terminal IN70 and outputs the differential signals from the output terminal OP70 and the output terminal ON70.

Figure 12:
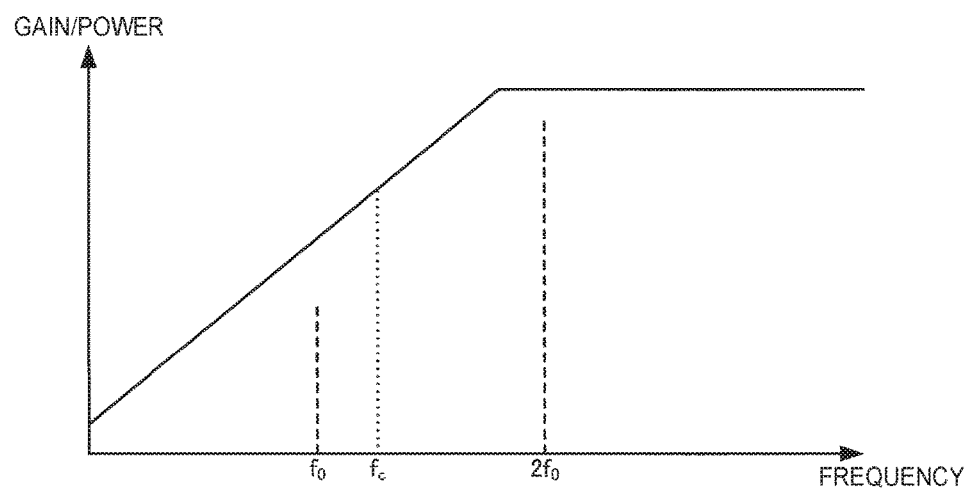
FIG. 12 is a view showing an example of frequency characteristics of the high pass filter.

FIG. 12 is a view showing an example of frequency characteristics of the high pass filter 70. FIG. 12 also shows frequency spectra of the output signal of the multiplication circuit 60 which is the input signal of the high pass filter 70. In FIG. 12, a horizontal axis indicates the frequency and a vertical axis indicates the gain (case of frequency characteristics of high pass filter 70) or power (case of frequency spectra of output signal of multiplication circuit 60). As shown in FIG. 12, a resistance value of each resistor, a capacitance value of each capacitor, and an inductance value of the coil 74 are set so that the cut-off frequency $f_c$ of the high pass filter 70 is between $f_0$ and $2f_0$. As described above, the multiplication circuit 60 outputs differential signals of $2f_0$ having a small amount of signal components of $f_0$ having high purity (high frequency accuracy), but as shown in FIG. 12, the signal components of $f_0$ which is lower than the cut-off frequency $f_c$ are attenuated by the high pass filter 70, and accordingly, differential signals of $2f_0$ having high purity (high frequency accuracy) are obtained.

Returning to FIG. 6, the non-inversion output terminal (output terminal OP70 of FIG. 11) of the high pass filter 70 is connected to the non-inversion input terminal of the output circuit 80. The inversion output terminal (output terminal ON70 of FIG. 11) of the high pass filter 70 is connected to an inversion input terminal of the output circuit 80.

The output circuit 80 is provided at a stage subsequent to the multiplication circuit 60 and the high pass filter 70. The output circuit 80 is operated by differential motion, generates differential signals obtained by converting differential signals input to the non-inversion input terminal and inversion input terminal into signals at a desired voltage level (or current level), and outputs the differential signals from the non-inversion output terminal and the inversion output terminal. The non-inversion output terminal of the output circuit 80 is connected to the output terminal T5 of the integrated circuit 3 and the inversion output terminal of the output circuit 80 is connected to the output terminal T6 of the integrated circuit 3. The output terminal T5 of the integrated circuit 3 is connected to a CP terminal which is an external terminal of the oscillation module 1 and the output terminal T6 of the integrated circuit 3 is connected to a CN terminal which is an external terminal of the oscillation module 1. The differential signals (oscillation signals) converted by the output circuit 80 are output to the external portion from the CP terminal and the CN terminal of the oscillation module 1 through the output terminal T5 and the output terminal T6 of the integrated circuit 3.

Figure 13:
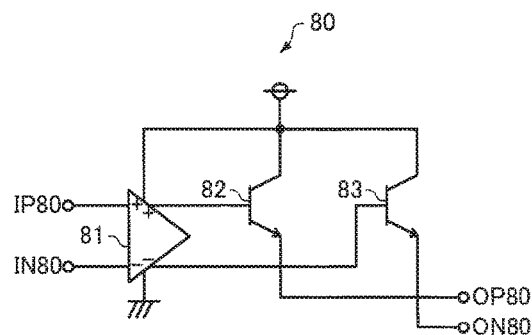
FIG. 13 is a view showing an example of a circuit configuration of an output circuit.

FIG. 13 is a view showing an example of a circuit configuration of the output circuit 80. In the example of FIG. 13, the output circuit 80 is configured to include a differential amplifier 81, an NPN transistor 82, and an NPN transistor 83. In FIG. 13, an input terminal IP80 is a non-inversion input terminal and an input terminal IN80 is an inversion input terminal, for example. In addition, an output terminal OP80 is a non-inversion output terminal and an output terminal ON80 is an inversion output terminal.

In the differential amplifier 81, a non-inversion input terminal is connected to the input terminal IP80, an inversion input terminal is connected to the input terminal IN80, a non-inversion output terminal is connected to a base terminal of the NPN transistor 82, and an inversion output terminal is connected to a base terminal of the NPN transistor 83, and the differential amplifier is operated with a power supply voltage VDD supplied from the power supply terminal T7 (see FIG. 6) and the grounding terminal T8.

In the NPN transistor 82, a base terminal is connected to the non-inversion output terminal of the differential amplifier 81, a collector terminal is connected to the power supply terminal T7 (see FIG. 6), and an emitter terminal is connected to the output terminal OP80.

In the NPN transistor 83, a base terminal is connected to the inversion output terminal of the differential amplifier 81, a collector terminal is connected to the power supply terminal T7 (see FIG. 6), and an emitter terminal is connected to the output terminal ON80.

The output circuit 80 configured as described above is a positive emitter coupled logic (PECL) circuit or a low-voltage positive emitter coupled logic (LV-PECL) circuit, and pulls down the output terminal OP80 and the output terminal ON80 to a predetermined voltage V1 to convert differential signals input from the input terminal IP80 and the input terminal IN80 into differential signals in which a high level is set as VDD−$V_{CE}$ and a low level is set as V1, and outputs the differential signals from the output terminal OP80 and the output terminal ON80. The voltage $V_{CE}$ is a voltage between the collector and emitter terminals of the NPN transistor 82 or the NPN transistor 83.

According to the oscillation module 1 of the embodiment described above, even when noise is superimposed on the power supplied to each circuit (the differential amplifier 40, the multiplication circuit 60, the high pass filter 70, and the output circuit 80) at a stage subsequent to the oscillation circuit 100 due to the operation of the oscillation circuit 100, since all of the circuits are operated by differential motion, the power supply noise superimposed on the differential signals (oscillation signals) output by each circuit becomes common mode noise. Therefore, according to the oscillation module 1 of the embodiment, it is possible to output oscillation signals in which degradation due to the effect of the power supply noise generated due to the operation of the oscillation circuit 100 is reduced.

According to the oscillation module 1 of the embodiment, since the multiplication circuit 60 is provided at a stage subsequent to the oscillation circuit 100, it is possible to output oscillation signals at a frequency obtained by the multiplication of a frequency of the oscillation signal output by the oscillation circuit 100.

According to the oscillation module 1 of the embodiment, since the oscillation circuit 100 is operated by differential motion, the amount of power supply noise to be superimposed on the differential signals (oscillation signals) propagating on the feedback path of the oscillation circuit 100 as common mode noise is significantly decreased. Therefore, according to the oscillation module 1 of the embodiment, it is possible to improve frequency accuracy and S/N of the oscillation signal.

According to the oscillation module 1 of the embodiment, since the multiplication circuit 60 is an equilibrium modulation circuit, a signal at the same frequency as that of the signal input to the multiplication circuit 60 is not output from the multiplication circuit 60, in principle (only signal obtained by the multiplication of the frequency of the signal input is output). Therefore, according to the oscillation module 1 of the embodiment, an oscillation signal at a multiplication frequency having high frequency accuracy is obtained.

In addition, in the oscillation module 1 of the embodiment, the oscillation circuit 100 outputs the differential signals and the circuits (the differential amplifier 40, the multiplication circuit 60, and the high pass filter 70) on the signal path from the oscillation circuit 100 to the output circuit 80 is operated by differential motion. Since the power supply noise generated by the operation of the oscillation circuit 100 is superimposed on the differential signal input to each circuit through the power supply line as common mode noise, each circuit can output a differential signal having significantly reduced power supply noise by being operated by differential motion. The power supply noise (common mode noise) superimposed on the input signal of the output circuit 80 through the power supply line is also significantly reduced by operating the output circuit 80 by differential motion, in the same manner as described above. As described above, the oscillation module 1 of the embodiment can output an oscillation signal having high frequency accuracy in which degradation due to the effect of the power supply noise generated by the operation of the oscillation circuit 100 is reduced.

According to the oscillation module 1 of the embodiment, it is possible to optimally set a frequency accuracy of an oscillation signal by suitably selecting an amplification factor of the differential amplifier 20 provided in the oscillation circuit 100 and an amplification factor of the differential amplifier 40 provided at a stage subsequent to the oscillation circuit 100. According to the oscillation module 1 of the embodiment, since it is possible to reduce the signal of unnecessary frequency components contained in the oscillation signal output by the multiplication circuit 60 by the high pass filter 70, it is possible to improve frequency accuracy of the oscillation signal.

1-3. Layout of Integrated Circuit

Figure 14:
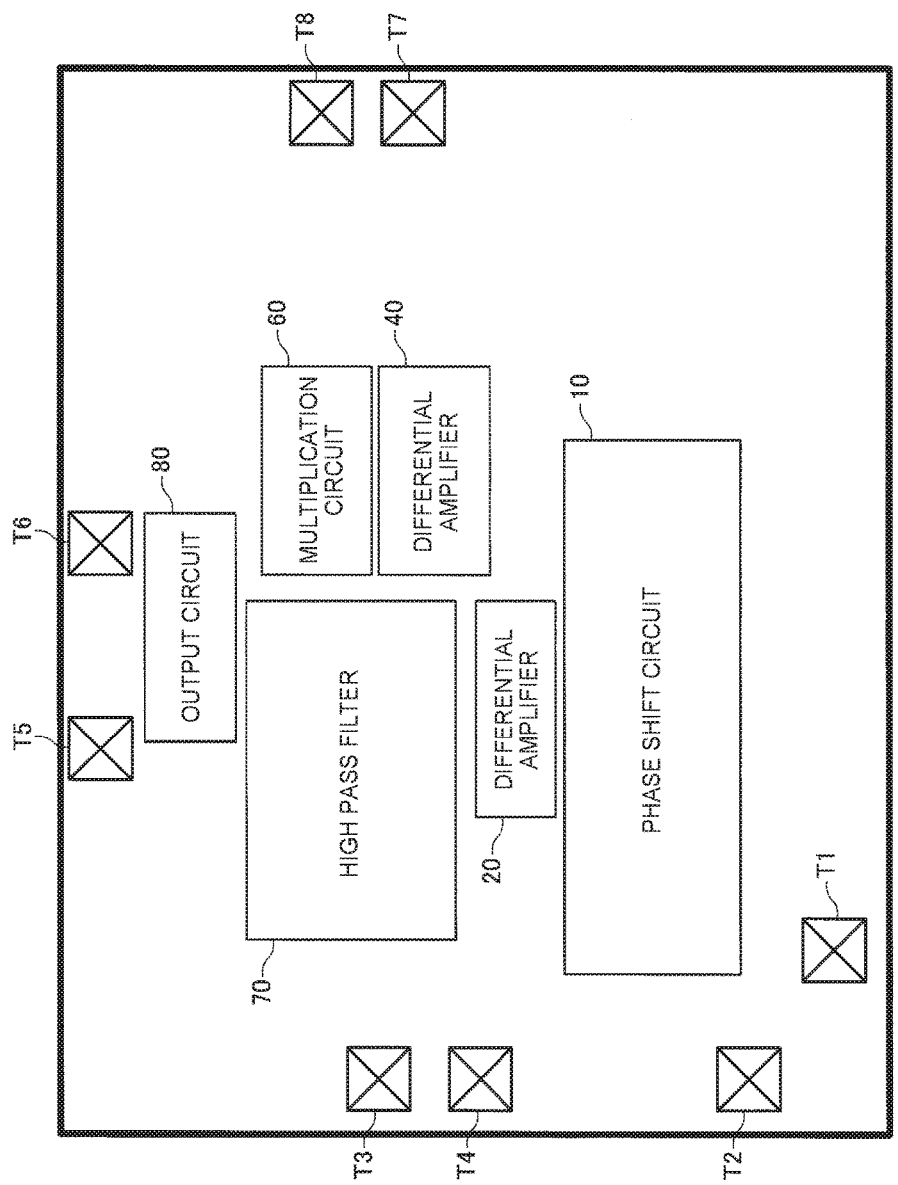
FIG. 14 is a view showing an example of layout arrangement of the integrated circuit.
Figure 15:
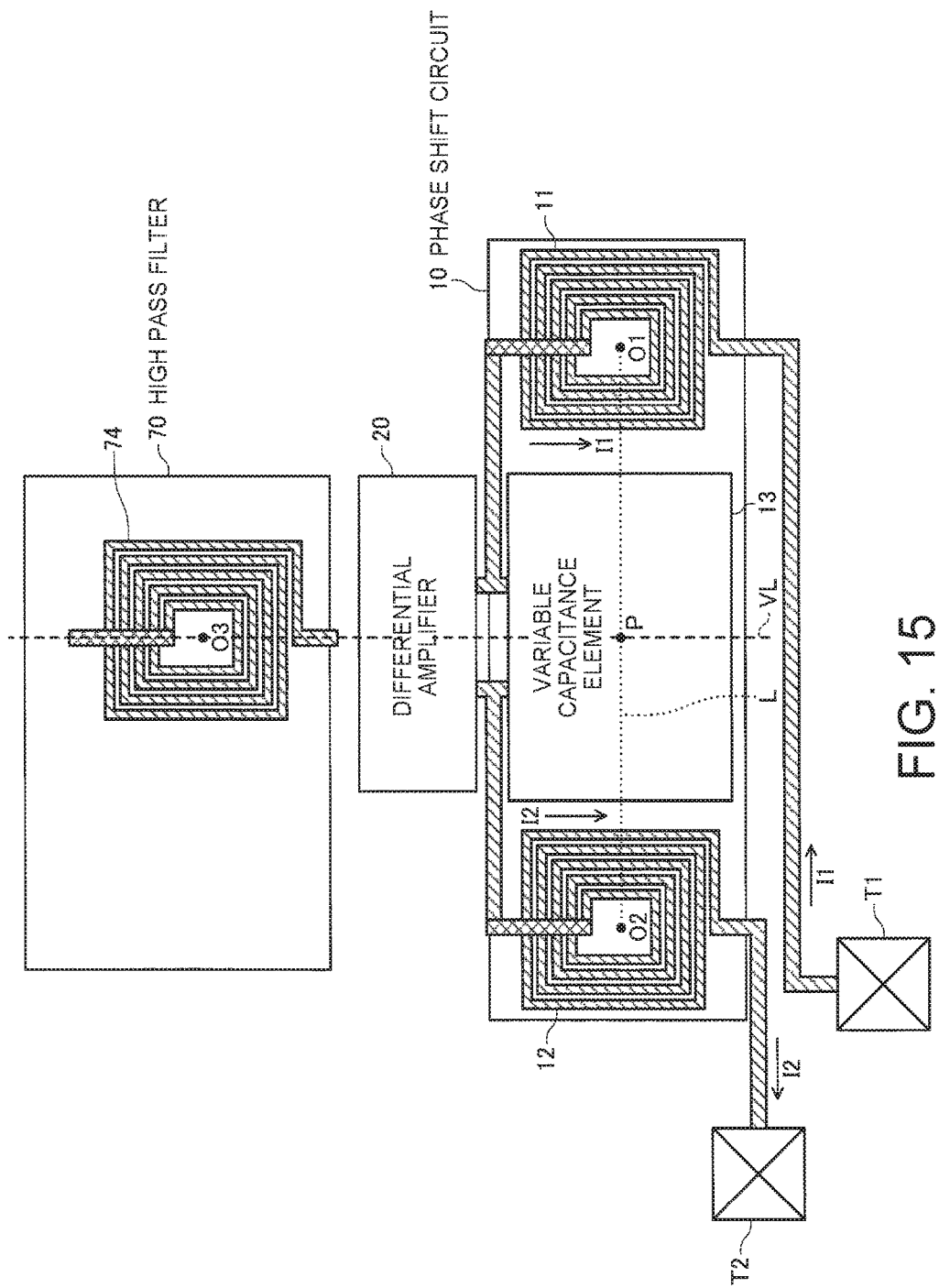
FIG. 15 is an enlarged view of a part of the layout arrangement of the integrated circuit.

In the oscillation module 1 of the embodiment, the layout of the integrated circuit 3 is worked in order to improve frequency accuracy of the differential signal output from the integrated circuit 3. FIG. 14 is a view showing an example of the layout arrangement of each circuit (excluding some) contained in the integrated circuit 3. FIG. 14 is a view when the integrated circuit 3 is seen in a plan view from a direction orthogonal to a surface of a semiconductor substrate where various elements (transistors or resistors) are laminated. FIG. 15 is an enlarged view of parts of the input terminal T1, the input terminal T2, the phase shift circuit 10, the differential amplifier 20, and the high pass filter 70 among the view of the layout arrangement of FIG. 14. In FIG. 15, the layout arrangement or some wiring patterns of the coil 11, the coil 12, and the variable capacitance element 13 contained in the phase shift circuit 10, and the coil 74 contained in the high pass filter 70 are shown.

In FIG. 15, a virtual straight line VL is a straight line which passes a center point P between a center O1 of the coil 11 and a center O2 of the coil 12 and is orthogonal to a line segment L connecting the center O1 of the coil 11 and the center O2 of the coil 12, that is, a straight line which is equidistant from the center O1 of the coil 11 and the center O2 of the coil 12.

In the embodiment, as shown in FIG. 15, the coil 74 is arranged so as to cross the virtual straight line VL which is equidistant from the center O1 of the coil 11 and the center O2 of the coil 12 in a plan view of the integrated circuit 3. As shown in FIG. 15, the coil 74 may be arranged so that a center O3 thereof is on the virtual straight line VL. When the wiring pattern of the coil 11 and the wiring pattern of the coil 12 are the same with each other, the directions of a current I1 flowing to the coil 11 and a current I2 flowing to the coil 12 are opposite to each other (opposite phases). That is, when the clockwise current I1 flows to the coil 11, the counterclockwise current I2 flows to the coil 12, and when the counterclockwise current I1 flows to the coil 11, the clockwise current I2 flows to the coil 12. Accordingly, on the virtual straight line VL, a direction of a magnetic field generated by the coil 11 and a direction of a magnetic field generated by the coil 12 are opposite to each other and are weakened. When the wiring pattern of the coil 11 and the wiring pattern of the coil 12 are the same with each other, ideally, the inductance of the coil 11 and the inductance of the coil 12 are the same with each other and the current I1 and the current I2 are the same with each other. Practically, even after considering a manufacturing variation of wirings or various elements, since a difference between the inductance of the coil 11 and the inductance of the coil 12 or a difference between the current I1 and the current I2 is small, strength of a magnetic field generated by the coil 11 and strength of a magnetic field generated by the coil 12 are substantially the same with each other on the virtual straight line and are substantially canceled. Accordingly, with a magnetic field coupling between the coil 74 arranged so as to cross with the virtual straight line VL and the coil 11 and the coil 12, it is possible to decrease a level of a signal of $f_0$ superimposed on a signal of $2f_0$ output by the high pass filter 70, and the oscillation module 1 can output an oscillation signal having high frequency accuracy.

In the embodiment, as shown in FIG. 15, the variable capacitance element 13 is arranged between the coil 11 and the coil 12 in a plan view of the integrated circuit 3. As described above, the variable capacitance element 13 which is hardly affected by the magnetic field is arranged close to the coil 11 and the coil 12 and between the coil 11 and the coil 12 where the effect of the magnetic field generated by the coil 11 or the magnetic field generated by the coil 12 is easily received, it is possible to prevent an unnecessary increase in layout area. In addition, since both of the wiring connecting the other end of the coil 11 and one end of the variable capacitance element 13 and the wiring connecting the other end of the coil 12 and the other end of the variable capacitance element 13 are shortened, it is possible to reduce the layout area and to decrease parasitic capacitance or parasitic resistance of the wirings.

In the embodiment, as shown in FIG. 15, the differential amplifier 20 is arranged between the variable capacitance element 13 and the coil 74 in a plan view of the integrated circuit 3. With such layout arrangement, it is possible to increase the distance between the coil 11 and the coil 74 or the distance between the coil 12 and the coil 74 by the length of the differential amplifier 20 while preventing an unnecessary increase in layout area, and therefore, it is possible to decrease strength of the magnetic field from the coil 11 and strength of the magnetic field from the coil 12 received by the coil 74. Accordingly, it is possible to further decrease a level of the signal of $f_0$ superimposed on the signal of $2f_0$ output by the high pass filter 70 due to the magnetic field coupling of the coil 11, the coil 12, and the coil 74, and the oscillation module 1 can output an oscillation signal having higher frequency accuracy.

By shortening the distance between the variable capacitance element 13 and the differential amplifier 20, both of the wiring connecting the other end of the coil 11 and the non-inversion input terminal of the differential amplifier 20 and the wiring connecting the other end of the coil 12 and the inversion input terminal of the differential amplifier 20 are shortened as a result. Accordingly, it is possible to reduce the layout area, parasitic capacitance or parasitic resistance of the signal path from the other end of the coil 11 to the non-inversion input terminal of the differential amplifier 20 and the parasitic capacitance or parasitic resistance of the signal path from the other end of the coil 12 to the inversion input terminal of the differential amplifier 20 are decreased, and it is possible to reduce deviation from 180° of a phase difference of a differential signal propagating on the two signal paths or a noise level superimposed on the differential signals.

In the embodiment, as shown in FIG. 15, the distance (for example, center-to-center distance) between the coil 11 and the input terminal T1 (first pad) connected to the coil 11 with a wiring is shorter than the distance (for example, center-to-center distance) between the coil 74 and the input terminal T1. In addition, the distance (for example, center-to-center distance) between the coil 12 and the input terminal T2 (second pad) connected to the coil 12 with a wiring is shorter than the distance (for example, center-to-center distance) between the coil 74 and the input terminal T2. With such layout arrangement, since the wiring connecting the input terminal T1 and the coil 11 or the wiring connecting the input terminal T2 and the coil 12 is shortened, it is possible to reduce the layout area and to decrease the parasitic capacitance or parasitic resistance of the wirings. Therefore, both of parasitic capacitance or parasitic resistance of a signal path from the input terminal T1 to one end of the coil 11 and parasitic capacitance or parasitic resistance of a signal path from the input terminal T2 to one end of the coil 12 are decreased, and it is possible to reduce deviation from 180° of a phase difference of a differential signal propagating on the two signal paths or a noise level superimposed on the differential signals.

With such layout arrangement, the distance between the input terminal T1 and the coil 74 or the distance between the input terminal T2 and the coil 74 (that is, distance from the output terminal of the high pass filter 70) is increased. Accordingly, it is possible to reduce a possibility that the frequency component $f_0$ of the current flowing to the coil 11 or the coil 12 is coupled with the current of frequency $2f_0$ flowing to the coil 74 through the input terminal T1 or the input terminal T2. That is, the signal of $f_0$ input to the input terminal T1 or the input terminal T2 is hardly superimposed on the signal of $2f_0$ output by the high pass filter 70, and the oscillation module 1 can output an oscillation signal having high frequency accuracy.

In the embodiment, as shown in FIG. 15, the differential amplifier 20 and the variable capacitance element 13 are arranged so as to cross the virtual straight line VL which is at equivalent distance from the center O1 of the coil 11 and the center O2 of the coil 12 in a plan view of the integrated circuit 3. With such layout arrangement, it is possible to reduce a difference between the length of the wiring connecting the other end of the coil 11 and the non-inversion input terminal of the differential amplifier 20 and the length of the wiring connecting the other end of the coil 12 and the inversion input terminal of the differential amplifier 20. In the same manner as described above, it is possible to reduce a difference between the length of the wiring connecting one end of the variable capacitance element 13 and the non-inversion input terminal of the differential amplifier 20 and the length of the wiring connecting the other end of the variable capacitance element 13 and the inversion input terminal of the differential amplifier 20. Accordingly, a difference in parasitic capacitance or parasitic resistance of a signal path from the other end of the coil 11 to the non-inversion input terminal of the differential amplifier 20 and a signal path from the other end of the coil 12 to the inversion input terminal of the differential amplifier 20, and it is possible to reduce deviation from 180° of a phase difference of a differential signal propagating on the two signal paths or a difference in a noise level superimposed on the differential signals. Therefore, it is possible to improve frequency accuracy and S/N of the oscillation signal output by the oscillation circuit 100.

In the embodiment, as shown in FIG. 14, the differential amplifier 40 is provided to be close to the differential amplifier 20, the multiplication circuit 60 is provided in a position close to both of the differential amplifier 40 and the high pass filter 70, the output circuit 80 is provided to be close to the high pass filter 70, and the output terminal T5 and the output terminal T6 are provided to be close to the output circuit 80. With such layout arrangement, it is possible to shorten each wiring connecting each circuit. Accordingly, it is possible to reduce the layout area of the integrated circuit 3, and it is possible to reduce deviation from 180° of a phase difference of a differential signal propagating from the input terminal T1 and the input terminal T2 to the output terminal T5 and the output terminal T6 or a noise level superimposed on the differential signals.

As described above, according to the oscillation module 1 of the embodiment, it is possible to satisfy both of reduction (size reduction) of the layout area of the integrated circuit 3 and output of the differential signal having high frequency accuracy, by using the layout arrangement shown in FIG. 14 and FIG. 15.

1-4. Modification Examples

Figure 16:
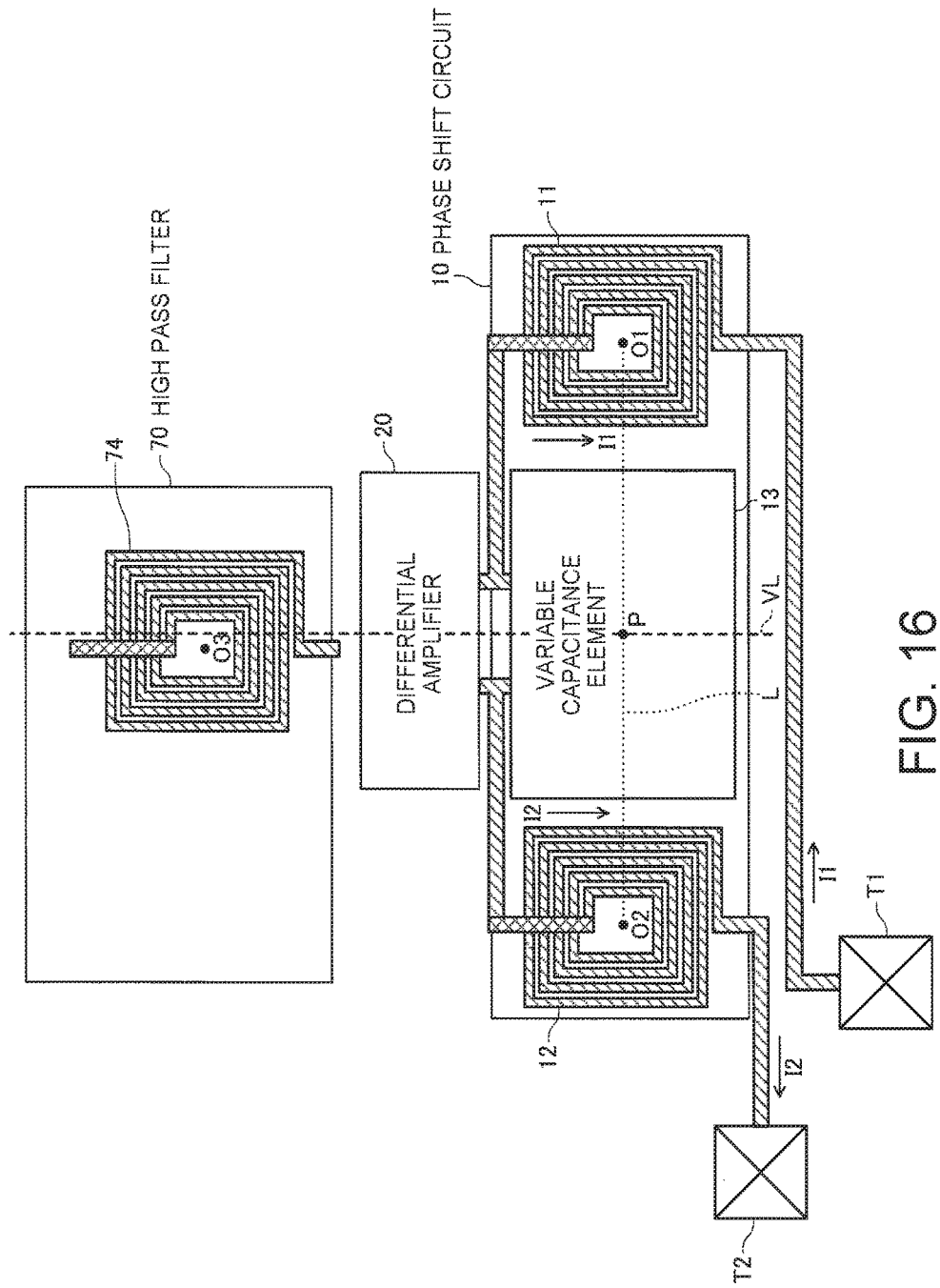
FIG. 16 is a view showing an arrangement example of a coil of a modification example.
Figure 17:
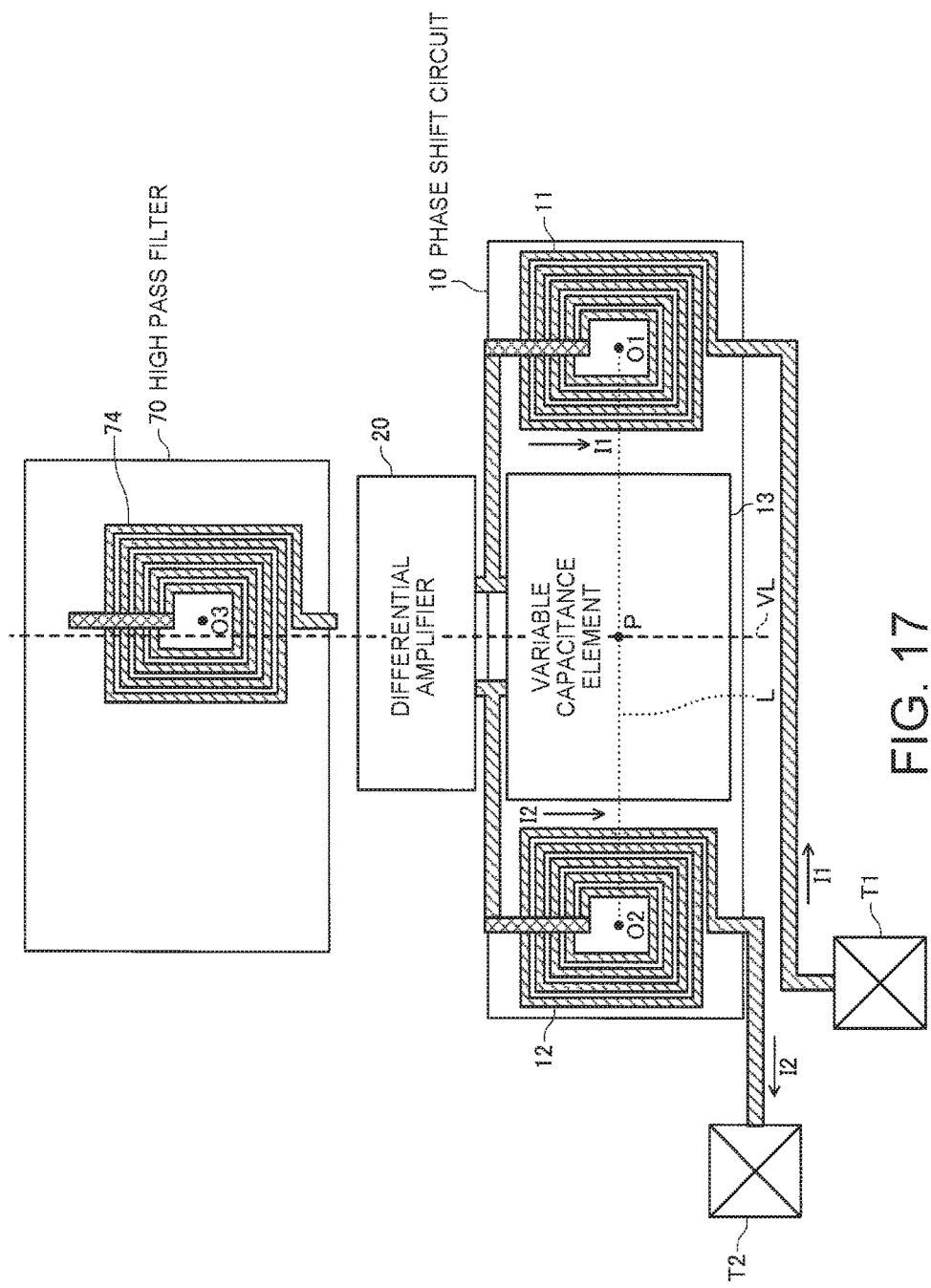
FIG. 17 is a view showing an arrangement example of a coil of another modification example.

In the embodiment, as shown in FIG. 15, the coil 74 is arranged so that the center O3 thereof is on the virtual straight line VL, the coil 74 may be arranged so as to cross the virtual straight line VL, and as shown in FIG. 16 or FIG. 17, the center O3 may not be on the virtual straight line VL.

In the embodiment, a variable range of the oscillation frequency is widened by providing the coil 11 and the coil 12 as members having inductance, on a feedback path from the first output port OP1 and the second output port OP2 to the first input port IP1 and the second input port IP2 of the SAW filter 2. With respect to this, other members having inductance may be provided on the feedback path, instead of the coil 11 and the coil 12 or together with the coil 11 and the coil 12. As members having inductance other than the coils, a bonding wire or a substrate wiring is used, for example, and the oscillation circuit 100 can change an oscillation frequency over a variable range according to an inductance value of the bonding wire or the substrate wiring.

In the oscillation module 1 of the embodiment, the high pass filter 70 containing the cut-off frequency $f_c$ higher than the frequency $f_0$ and containing the frequency $2f_0$ in a passband at a stage subsequent to the multiplication circuit 60, but the high pass filter may be replaced with a band pass filter containing the cut-off frequency on a low band side higher than the frequency $f_0$ and containing the frequency $2f_0$ in a passband.

2. Electronic Device

Figure 18:
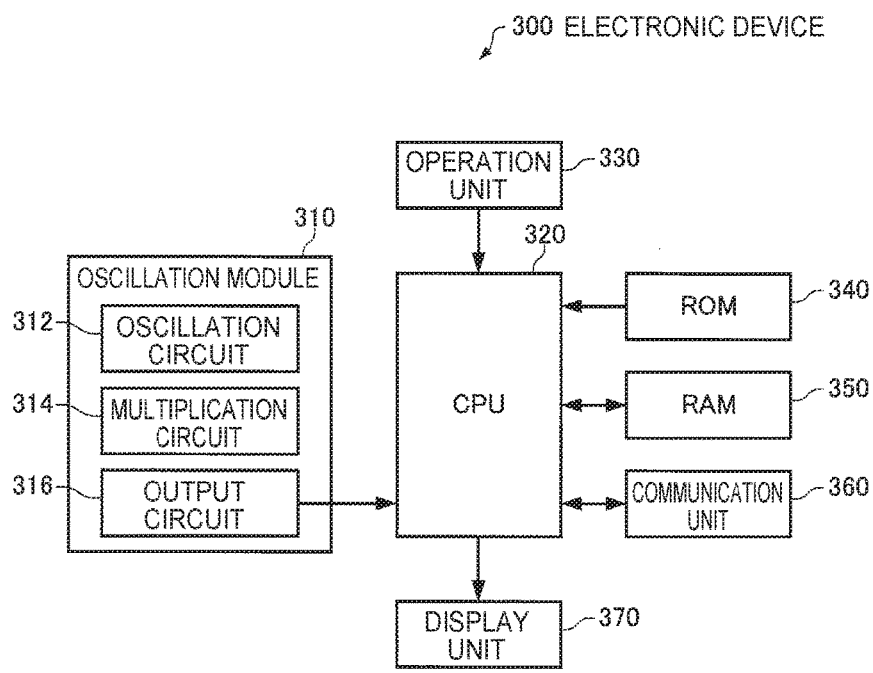
FIG. 18 is a functional block diagram showing an example of a configuration of an electronic device of the embodiment.

FIG. 18 is a functional block diagram showing an example of a configuration of an electronic device of the embodiment. An electronic device 300 of the embodiment is configured to include an oscillation module 310, a central processing unit (CPU) 320, an operation unit 330, a read only memory (ROM) 340, a random access memory (RAM) 350, a communication unit 360, and a display unit 370. In the electronic device 300 of the embodiment, some of the constituent elements (units) of FIG. 18 may be omitted or modified, and the other constituent elements may be added.

The oscillation module 310 includes an oscillation circuit 312. The oscillation circuit 312 includes a SAW filter (not shown) and generates an oscillation signal at a frequency based on a resonance frequency of the SAW filter.

The oscillation module 310 may include a multiplication circuit 314 or an output circuit 316 at a stage subsequent to the oscillation circuit 312. The multiplication circuit 314 generates an oscillation signal obtained by multiplying the frequency of the oscillation signal generated by the oscillation circuit 312. The output circuit 316 outputs the oscillation signal generated by the multiplication circuit 314 or the oscillation signal generated by the oscillation circuit 312 to the CPU 320. The oscillation circuit 312, the multiplication circuit 314, and the output circuit 316 may be operated by differential motion.

The CPU 320 performs various calculation processes or control processes by using the oscillation signal input from the oscillation module 310 as a clock signal according to a program stored in the ROM 340 or the like. Specifically, the CPU 320 performs various processes according to an operation signal from the operation unit 330, a process of controlling the communication unit 360 for performing data communication with an external device, or a process of transmitting a display signal for displaying various information items on the display unit 370.

The operation unit 330 is an input device configured with an operation key or a button switch, and outputs the operation signal according to the operation performed by a user to the CPU 320.

The ROM 340 stores a program or data allowing the CPU 320 to perform various calculation processes or control processes.

The RAM 350 is used as an operation area of the CPU 320, and temporarily stores a program or data read out from the ROM 340, data input from the operation unit 330, and an operation result executed according to various programs by the CPU 320.

The communication unit 360 performs various controls for satisfying data communication between the CPU 320 and an external device.

The display unit 370 is a display device configured with a liquid crystal display (LCD) or the like, and displays various information items based on a display signal input from the CPU 320. A touch panel functioning as the operation unit 330 may be provided in the display unit 370.

It is possible to realize an electronic device having high reliability, by using the oscillation circuit 100 of the embodiment, for example, as the oscillation circuit 312 or using the oscillation module 1 of the embodiment described above, for example, as the oscillation module 310.

Various electronic devices are considered as the electronic device 300. For example, a network device such as a beam transmission device using optical fiber, a broadcasting device, a communication device used in a satellite or a base station, a global positioning system (GPS) module, a personal computer (for example, a mobile-type personal computer, a laptop-type personal computer, or a tablet-type personal computer), a moving object terminal such as a smart phone or a mobile phone, a digital still camera, an ink jet type discharging apparatus (for example, ink jet printer), a storage area network apparatus such as a router or a switch, a local area network apparatus, an apparatus for moving object terminal base station, a television, a video camera, a video recorder, a car navigation apparatus, a real-time clock device, a pager, an electronic organizer (including a communication function), an electronic dictionary, a calculator, an electronic game device, a game controller, a word processer, a work station, a video phone, a security monitor, electronic binoculars, a point of sale (POS) terminal, medical equipment (for example, an electronic thermometer, a blood pressure meter, a blood glucose meter, an ECG measuring device, an ultrasound diagnostic device, an electronic endoscope), a fishfinder, a variety of measurement equipment, a meter (for example, meters for vehicles, aircraft, ships), a flight simulator, a head mounted display, motion tracing, motion tracking, a motion controller, PDR (pedestrian position and azimuth measurement), and the like can be exemplified.

As an example of the electronic device 300 of the embodiment, a transmission device functioning as an apparatus for terminal base station which performs communication with a terminal in a wired or wireless manner, for example, using the oscillation module 310 described above as a reference signal source is exemplified. By using the oscillation module 1 of the embodiment, for example, as the oscillation module 310, it is possible to realize the desired electronic device 300 having higher frequency accuracy, higher performance, and higher reliability than the related art, which can be used in a communication base station, for example.

Another example of the electronic device 300 of the embodiment may be a communication device in which the communication unit 360 receives an external clock signal and the CPU 320 (processing unit) includes a frequency control unit which controls a frequency of the oscillation module 310 based on the external clock signal and an output signal of the oscillation module 310.

3. Moving Object

Figure 19:
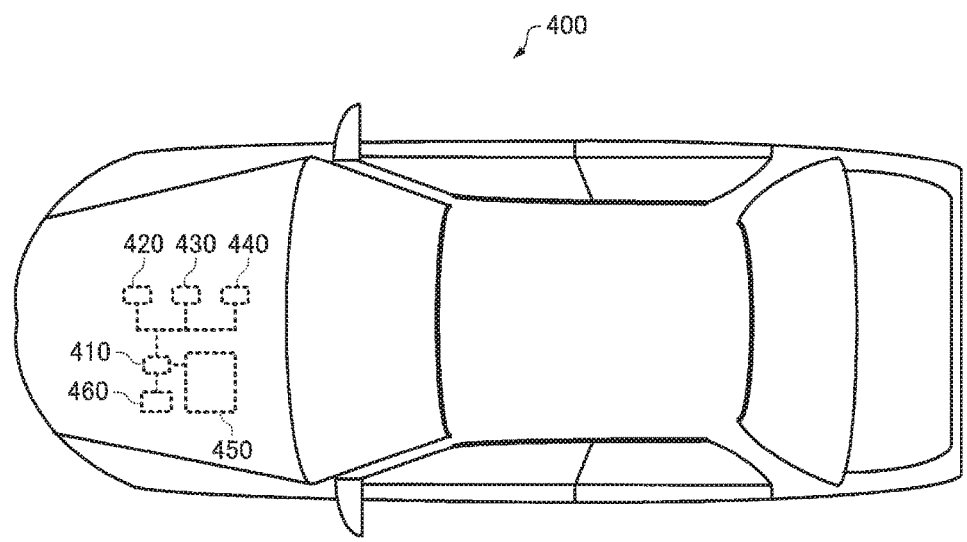
FIG. 19 is a view showing an example of a moving object of the embodiment.

FIG. 19 is a view (top view) showing an example of a moving object of the embodiment. A moving object 400 shown in FIG. 19 is configured to include an oscillation module 410, controllers 420, 430, and 440 which perform various controls of an engine system, a brake system, a keyless entry system and the like, a battery 450, and a backup battery 460. In the moving object 400 of the embodiment, a part of the constituent elements (units) shown in FIG. 19 may be omitted or modified, or other constituent elements may be added.

The oscillation module 410 includes an oscillation circuit (not shown) including a SAW filter (not shown) and generates an oscillation signal at a frequency based on a resonance frequency of the SAW filter.

The oscillation module 410 may include a multiplication circuit or an output circuit which is at a stage subsequent to this oscillation circuit. The multiplication circuit generates an oscillation signal obtained by multiplication of the frequency of the oscillation signal generated by the oscillation circuit. The output circuit outputs an oscillation signal generated by the multiplication circuit or an oscillation signal generated by the oscillation circuit. The oscillation circuit, the multiplication circuit, and the output circuit may be operated by differential motion.

The oscillation signal output by the oscillation module 410 is supplied to the controllers 420, 430, and 440 and is used, for example, as a clock signal.

The battery 450 supplies electric power to the oscillation module 410 and the controllers 420, 430, and 440. The backup battery 460 supplies electric power to the oscillation module 410 and the controllers 420, 430, and 440, when an output voltage of the battery 450 is decreased than a threshold value.

It is possible to realize a moving object having high reliability, by using the oscillation circuit 100 of each embodiment described above, for example, as an oscillation circuit included in the oscillation module 410 or the oscillation module 1 of each embodiment described above, for example, as the oscillation module 410.

Various moving objects are considered as the moving object 400, and include a vehicle (including an electric vehicle), an aircraft such as a jet or a helicopter, a ship, a rocket, or a satellite, for example.

The invention is not limited to the embodiments and various modifications can be made within a range of a gist of the invention.

The embodiments and the modification examples described above are merely examples and the invention is not limited thereto. For example, each embodiment and each modification example can be suitably combined with each other.

The invention includes substantially the same configuration as the configuration described in the embodiments (for example, a configuration having the same functions, methods, and results, or a configuration having the same object and effects). The invention includes a configuration obtained by replacing the non-essential parts of the configuration described in the embodiments. The invention includes a configuration for realizing the same operation effects or a configuration for reaching the same object as the configuration described in the embodiments. The invention includes a configuration obtained by adding the related art to the configuration described in the embodiments.

The entire disclosure of Japanese Patent Application No. 2015-209936, filed Oct. 26, 2015 is expressly incorporated by reference herein.

What is claimed is:

1. An oscillation module comprising:
an oscillation circuit which includes a first coil and a second coil; and
a filter circuit which is provided at a stage subsequent to the oscillation circuit and includes a third coil,
wherein the first coil, the second coil, and third coil are a part of an integrated circuit,
wherein the third coil is arranged so as to intersect a virtual straight line that is equidistant from (i) a center of the first coil and (ii) a center of the second coil, in a plan view of the integrated circuit,
wherein the integrated circuit includes (i) a first pad arranged to at least one of provide current to and receive current from the first coil and (ii) a second pad arranged to at least one of provide current to and receive current from the second coil, and
wherein a distance between the first coil and the first pad is shorter than a distance between the third coil and the first pad, and a distance between the second coil and the second pad is shorter than a distance between the third coil and the second pad.

2. The oscillation module according to claim 1,
wherein the oscillation circuit includes a variable capacitance element,
the variable capacitance element is a part of the integrated circuit, and
the variable capacitance element is arranged between the first coil and the second coil in a plan view of the integrated circuit.

3. The oscillation module according to claim 2,
wherein the oscillation circuit includes a differential amplifier,
the differential amplifier is a part of the integrated circuit, and
the differential amplifier is arranged between the variable capacitance element and the third coil in a plan view of the integrated circuit.

4. The oscillation module according to claim 2,
wherein the integrated circuit includes a first pad connected to the first coil and a second pad connected to the second coil, and
a distance between the first coil and the first pad is shorter than a distance between the third coil and the first pad, and a distance between the second coil and the second pad is shorter than a distance between the third coil and the second pad.

5. The oscillation module according to claim 3,
wherein the integrated circuit includes a first pad connected to the first coil and a second pad connected to the second coil, and
a distance between the first coil and the first pad is shorter than a distance between the third coil and the first pad, and a distance between the second coil and the second pad is shorter than a distance between the third coil and the second pad.

6. The oscillation module according to claim 4,
wherein the oscillation circuit includes a SAW filter including a first input port, a second input port, a first output port, and a second output port, and
the first pad is connected to the first output port and the second pad is connected to the second output port.

7. The oscillation module according to claim 5,
wherein the oscillation circuit includes a SAW filter including a first input port, a second input port, a first output port, and a second output port, and
the first pad is connected to the first output port and the second pad is connected to the second output port.

8. The oscillation module according to claim 6,
wherein a signal propagating from the first output port to the first input port and a signal propagating from the second output port to the second input port have phases opposite to each other.

9. The oscillation module according to claim 7,
wherein a signal propagating from the first output port to the first input port and a signal propagating from the second output port to the second input port have phases opposite to each other.

10. The oscillation module according to claim 1,
wherein the oscillation circuit receives a first differential signal and outputs a second differential signal based on the first differential signal.

11. The oscillation module according to claim 1, further comprising:
an output circuit which is provided at a stage subsequent to the filter circuit,
wherein the oscillation circuit outputs a differential signal, and
circuits on a signal path from the oscillation circuit to the output circuit are operated by differential motion.

12. An electronic device comprising:
the oscillation module according to claim 1.

13. A moving object comprising:
the oscillation module according to claim 1.

14. An oscillation module comprising:
a surface acoustic wave (SAW) resonator; and
an integrated circuit electrically connected to the SAW resonator, wherein:
the integrated circuit includes a first coil, a second coil, and a third coil;
the first coil, the second coil, and the third coil are spiral inductors integrated in the integrated circuit;
the third coil is arranged so as to, in a plan view of the integrated circuit, intersect a virtual straight line that is equidistant from (i) a center of the first coil and (ii) a center of the second coil;
the integrated circuit includes (i) a first pad arranged to at least one of provide current to and receive current from the first coil and (ii) a second pad arranged to at least one of provide current to and receive current from the second coil; and
a distance between the first coil and the first pad is shorter than a distance between the third coil and the first pad, and a distance between the second coil and the second pad is shorter than a distance between the third coil and the second pad.

15. The oscillation module according to claim 14,
wherein the integrated circuit is configured to oscillate the SAW resonator and output a differential output signal.

16. The oscillation module according to claim 14, further comprising:
a ceramic package including the SAW resonator and the integrated circuit.

17. The oscillation module according to claim 15, further comprising:
a ceramic package including the SAW resonator and the integrated circuit.

* * * * *